(12) United States Patent
Fukushima et al.

(10) Patent No.: US 10,955,700 B2
(45) Date of Patent: Mar. 23, 2021

(54) TRANSPARENT PANEL PROVIDED WITH LIGHT EMITTING FUNCTION

(71) Applicant: STANLEY ELECTRIC CO., LTD., Tokyo (JP)

(72) Inventors: Hiroto Fukushima, Tokyo (JP); Akihiko Hanya, Tokyo (JP); Kosaburo Ito, Tokyo (JP); Tsukasa Imura, Tokyo (JP); Reiki Tada, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/615,242

(22) PCT Filed: May 22, 2018

(86) PCT No.: PCT/JP2018/019698
§ 371 (c)(1),
(2) Date: Nov. 20, 2019

(87) PCT Pub. No.: WO2018/216698
PCT Pub. Date: Nov. 29, 2018

(65) Prior Publication Data
US 2020/0166802 A1 May 28, 2020

(30) Foreign Application Priority Data
May 25, 2017 (JP) .............................. JP2017-103288

(51) Int. Cl.
*G02F 1/13357* (2006.01)
*G02F 1/1343* (2006.01)
(Continued)

(52) U.S. Cl.
CPC .... *G02F 1/133603* (2013.01); *G02F 1/13476* (2013.01); *G02F 1/134309* (2013.01);
(Continued)

(58) Field of Classification Search
CPC ................................................ G02F 1/133603
See application file for complete search history.

(56) References Cited

U.S. PATENT DOCUMENTS

| | | |
|---|---|---|
| 9,232,573 B2 | 1/2016 | Miyashita |
| 9,328,899 B2 | 5/2016 | Kataoka et al. |

(Continued)

FOREIGN PATENT DOCUMENTS

| | | |
|---|---|---|
| JP | H101223414 A | 9/1989 |
| JP | H0517629 U | 3/1993 |

(Continued)

OTHER PUBLICATIONS

International Preliminary Report on Patentability (IPRP) dated Dec. 5, 2019 issued in International Application No. PCT/JP2018/019698.

(Continued)

*Primary Examiner* — Edmond C Lau
(74) *Attorney, Agent, or Firm* — Holtz, Holtz & Volek PC

(57) ABSTRACT

The present invention provides a panel capable of switching between a state transparent to external light, a point light emitting state, and a surface light emitting state. Provided is a transparent panel provided with light emitting function, including: an LED die; a light transmitting substrate for LED, on which the LED die is mounted; a wiring pattern provided on a surface of the light transmitting substrate for LED and bonded to the LED die; and a light diffusing panel laminated on the light transmitting substrate for LED. The light diffusing panel includes: a pair of light transmitting substrates for liquid crystal; a liquid crystal layer sandwiched between the pair of light transmitting substrates for liquid crystal; and transparent conductive films disposed on (Continued)

the light transmitting substrates for liquid crystal, and is switchable between a transparent state and a light diffusion state.

19 Claims, 18 Drawing Sheets

(51) Int. Cl.
*G02F 1/1347* (2006.01)
*H01L 23/00* (2006.01)
*H01L 25/075* (2006.01)
*H01L 33/62* (2010.01)
*G02F 1/1334* (2006.01)

(52) U.S. Cl.
CPC .......... *H01L 24/83* (2013.01); *H01L 25/0753* (2013.01); *H01L 33/62* (2013.01); *G02F 1/1334* (2013.01); *G02F 2001/133612* (2013.01); *H01L 2224/8322* (2013.01); *H01L 2224/8384* (2013.01); *H01L 2933/0066* (2013.01)

(56) References Cited

U.S. PATENT DOCUMENTS

| | | | |
|---|---|---|---|
| 2012/0169953 A1 | 7/2012 | Kataoka et al. | |
| 2013/0222754 A1* | 8/2013 | Kohtoku | H01T 23/00 349/161 |
| 2014/0369072 A1* | 12/2014 | Liao | G09G 3/34 362/613 |
| 2015/0115793 A1* | 4/2015 | Miyashita | H01L 33/60 313/512 |
| 2015/0323158 A1 | 11/2015 | Kuroda | |
| 2015/0370131 A1* | 12/2015 | Ning | G02F 1/133608 349/61 |
| 2016/0179452 A1 | 6/2016 | Huang et al. | |
| 2018/0090469 A1* | 3/2018 | Hanya | H01L 25/50 |

FOREIGN PATENT DOCUMENTS

| | | |
|---|---|---|
| JP | 2007085781 A | 4/2007 |
| JP | 2009117496 A | 5/2009 |
| JP | 2015084374 A | 4/2015 |
| WO | 2011030578 A1 | 3/2011 |
| WO | 2014115311 A1 | 7/2014 |

OTHER PUBLICATIONS

International Search Report (ISR) dated Aug. 14, 2018 (and its English language translation) issued in International Application No. PCT/JP2018/019698.

Written Opinion (WO) dated Aug. 14, 2018 issued in International Application No. PCT/JP2018/019698.

* cited by examiner

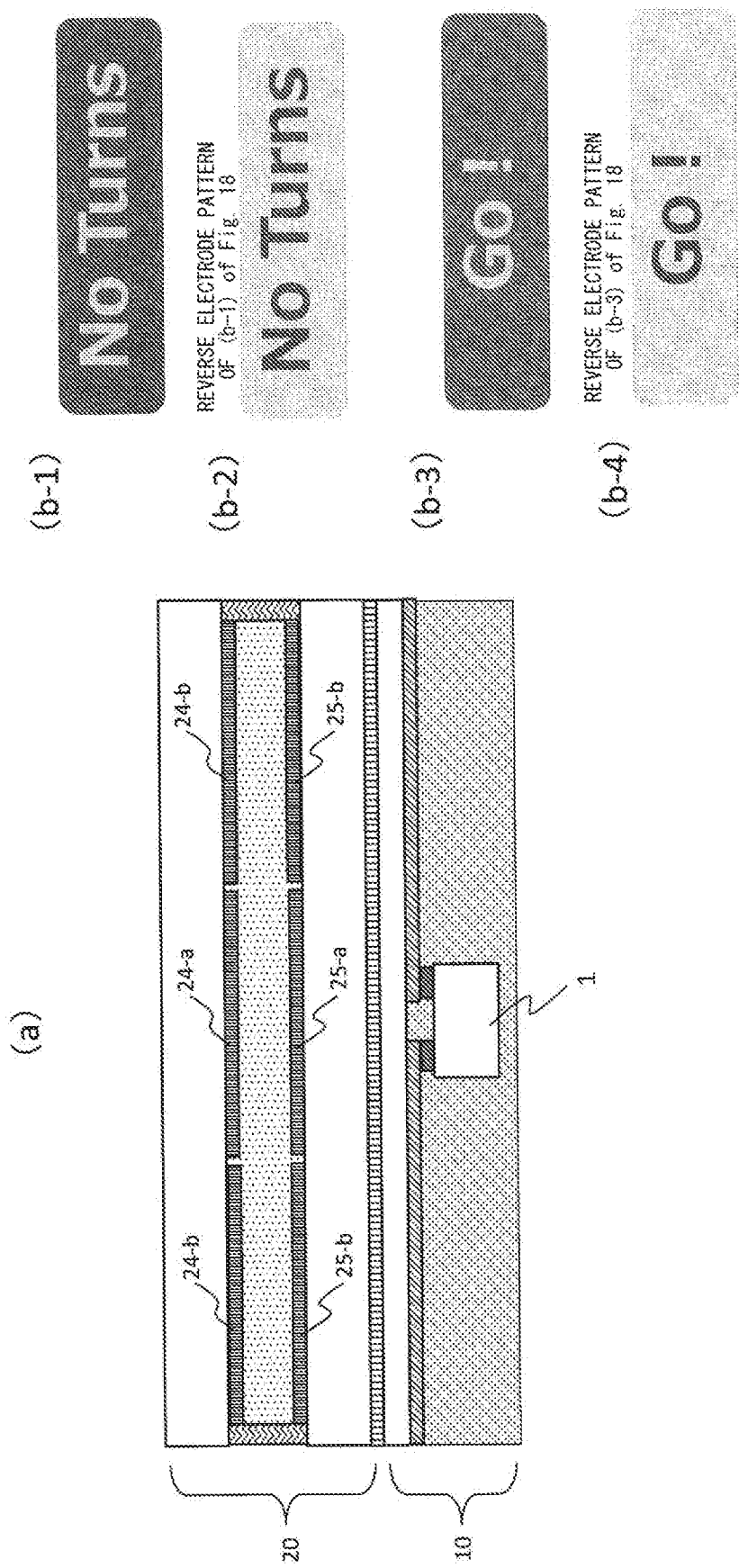

TRANSPARENT PANEL PROVIDED WITH LIGHT EMITTING FUNCTION

TECHNICAL FIELD

The present invention relates to a transparent panel incorporating a light source and capable of irradiating light having different diffusion states.

BACKGROUND ART

Patent Literature 1 discloses a light source device capable of arbitrarily changing the diffusion state of emitted light. The light source device has a structure in which a point light source of fluorescent light or a surface light source such as an LED panel is disposed on a lower surface of a liquid crystal panel with a polymer-dispersed liquid crystal layer sandwiched between transparent substrates, and changes voltage applied to the liquid crystal panel, so that the liquid crystal panel changes a degree of diffusion of the light from the light source.

On the other hand, Patent Literature 2 discloses a light source device for substrate inspection that reflects light from the point light source with a mirror, to irradiate the liquid crystal panel (a liquid crystal scattering plate), and condenses light passed through the liquid crystal panel with a Fresnel lens, to irradiate the substrate to be inspected. The light source device switches the liquid crystal panel to a transparent state or an opaque state by controlling the voltage applied to the liquid crystal panel. When the liquid crystal panel is in the transparent state, point light source illumination is applied to the substrate to be inspected, and when the liquid crystal panel is in the opaque state, surface light source illumination by scattered light is applied to the substrate to be inspected.

CITATION LIST

Patent Literature

Patent Literature 1: JP-UM-A-5-17629
Patent Literature 2: JP-A-2007-085781

SUMMARY OF THE INVENTION

Technical Problem

Both of the light source devices of Patent Literatures 1 and 2 can irradiate light having different diffusion states. However, since the liquid crystal panel and the light source are separate bodies, it is necessary to provide the light source and a reflection mirror separately from the liquid crystal panel.

An object of the present invention is to provide a panel capable of switching between a state transparent to external light, a point light emitting state, and a surface light emitting state while incorporating the light source.

Solution to Problem

In order to achieve the above object, the present invention provides a transparent panel provided with light emitting function, including: an LED die; a light transmitting substrate for LED, on which the LED die is mounted; a wiring pattern provided on a surface of the light transmitting substrate for LED and bonded to the LED die; and a light diffusing panel laminated on the light transmitting substrate for LED. The light diffusing panel includes: a pair of light transmitting substrates for liquid crystal; a liquid crystal layer sandwiched between the pair of light transmitting substrates for liquid crystal; and transparent conductive films disposed on the light transmitting substrates for liquid crystal, and is switchable between a transparent state and a light diffusion state.

Advantageous Effects of Invention

The present invention can provide a transparent panel provided with light emitting function, capable of switching between a state transparent to the external light, a point light emitting state, and a surface light emitting state while incorporating the light source.

BRIEF DESCRIPTION OF THE DRAWINGS

FIG. 18(a) is a cross-sectional view of the transparent panel provided with light emitting function of a tenth embodiment, and FIG. 18(b-1) to FIG. 18(b-4) are explanatory views showing examples of light emission pattern of an upper surface thereof.

DESCRIPTION OF EMBODIMENTS

Figure 1:
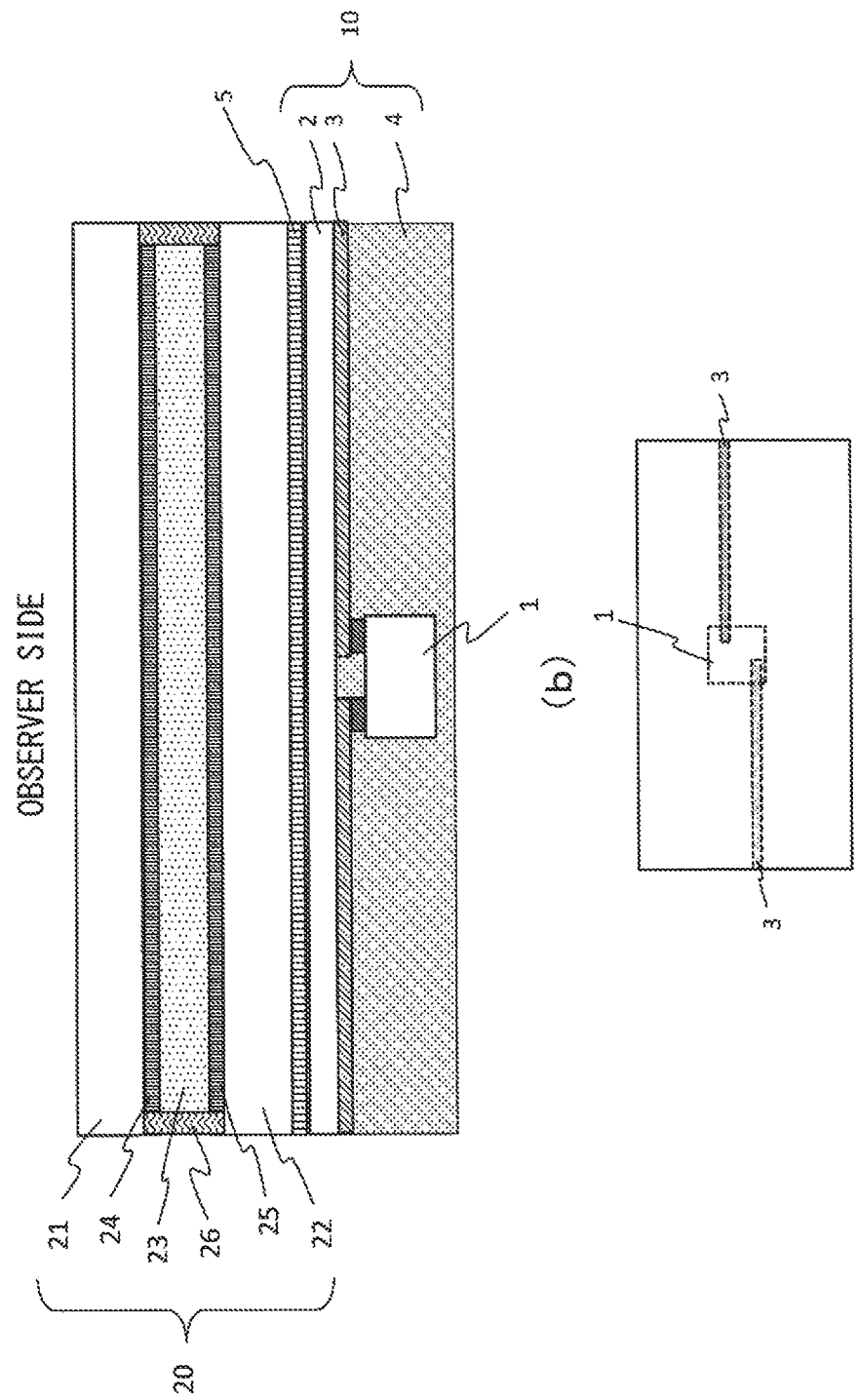
FIG. 1(*a*) is a cross-sectional view of a transparent panel provided with light emitting function of a first embodiment, and FIG. 1(*b*) is a top view thereof.

A light emitting device with a built-in light source of an embodiment of the present invention will be described with reference to the drawings.

First Embodiment

As shown in a cross-sectional view of FIG. 1(a) and a top view of FIG. 1(b), the transparent panel provided with light emitting function of the first embodiment includes: a light source device 10 including an LED die 1, a light transmitting substrate 2 for LED, on which the LED die 1 is mounted, a wiring pattern 3 provided on a surface of the light transmitting substrate 2 for LED and bonded to the LED die 1; and a light diffusing panel 20 laminated on the light transmitting substrate for LED.

The light diffusing panel 20 includes a pair of light transmitting substrates 21 and 22 for liquid crystal, a liquid crystal layer 23 sandwiched between the pair of light transmitting substrates 21 and 22 for liquid crystal, and transparent conductive films 24 and 25 disposed on the light transmitting substrates 21 and 22 for liquid crystal. Voltage applied to the liquid crystal layer 23 from the transparent conductive films 24 and 25 can change an alignment state of liquid crystal molecules in the liquid crystal layer 23, to switch between a light diffusion state and a transparent state.

The wiring pattern 3 includes, for example, a pattern in which a metal material such as a copper foil is bonded to the surface of the light transmitting substrate and then formed into a desired wiring shape by an etching method or the like, and plated as necessary, a pattern in which ink containing conductive particles and a thermosetting substance such as epoxy or silicone is formed on the light transmitting substrate, and cured into the desired wiring shape by heating or the like, or a pattern in which the ink containing conductive particles and solvent or dispersant is formed on the light transmitting substrate, and sintered into the desired wiring shape by heat or electromagnetic waves. The electromagnetic waves referred to here include those in wavelength ranges of ultraviolet light, visible light, infrared light and microwave.

In the light transmitting substrate 2 for LED, a surface on which the LED die 1 is not mounted is fixed to the light diffusing panel 20. The LED die 1 is mounted so as to emit light toward the light transmitting substrate 2. The light transmitting substrate 2 for LED and a light transmitting substrate 22 for liquid crystal of the light diffusing panel 20 are in close contact with each other, and may be bonded to each other by a transparent adhesive layer 5 or a sticky layer as shown in FIG. 1, or may be mechanically fixed using screws or the like.

A transparent sealing resin layer 4 may be disposed around the LED die 1.

The LED die 1 is a bare chip that is not packaged, and has a small size of about several millimeters square. Since the wiring pattern 3 for supplying current to such a small LED die 1 is fine, an area in which the LED die 1 and the wiring pattern 3 shield external light is extremely small, and the external light passes through the light transmitting substrate 2 for LED in other regions and is incident on the light diffusing panel 20.

When the voltage for switching the liquid crystal layer 23 of the light diffusing panel 20 to the transparent state is applied to the liquid crystal layer 23 by the transparent conductive films 24 and 25, the external light is transmitted through the light transmitting substrate 2 for LED, and is sequentially transmitted through the light transmitting substrate 22 for liquid crystal, the liquid crystal layer 23, and the light transmitting substrate 21 for liquid crystal of the light diffusing panel 20. Therefore, when the liquid crystal layer 23 transmits light and the LED die 1 does not emit light, the transparent panel of the present embodiment is transparent and transmits the external light.

Note that also when the liquid crystal layer 23 is in the transparent state with no voltage applied to the liquid crystal layer 23 of the light diffusing panel 20, the transparent panel is transparent and transmits the external light.

When the LED die 1 is caused to emit light with the liquid crystal layer 23 being transparent, the light emitted from the LED die 1 is transmitted through the light transmitting substrate 2 for LED with a divergence angle at the time of light emission being substantially maintained, and is sequentially transmitted through the light transmitting substrate 22 for liquid crystal, the liquid crystal layer 23, and the light-transmitting substrate 21 for liquid crystal. Therefore, when the LED die 1 is caused to emit light with the liquid crystal layer 23 transmitting light, the transparent panel of the present embodiment is a point emitting light source in which the light emitted from the LED die 1 is irradiated from an upper surface of the light diffusing panel 20 toward the outside with a substantially the same divergence angle.

On the other hand, when the voltage is applied by the transparent conductive films 24 and 25 so that the liquid crystal layer 23 of the light diffusing panel 20 is in a state of diffusing light, and the LED die 1 is caused to emit light, the light emitted from the LED die 1 is transmitted through the light transmitting substrate 2 for LED and the light transmitting substrate 22 for liquid crystal with the divergence angle at the time of light emission being substantially maintained, and is then incident on the liquid crystal layer 23. Incident light is diffused in the liquid crystal layer 23 to be expanded to an area corresponding to a degree of light diffusion of the liquid crystal layer 23, and is transmitted through the light transmitting substrate 21 for liquid crystal and emitted. The degree of light diffusion of the liquid crystal layer 23 depends on thickness of the liquid crystal layer 23 and a degree of alignment of liquid crystal molecules. Therefore, when the liquid crystal layer 23 is in the state of diffusing light and the LED die 1 is caused to emit light, the transparent panel of the present embodiment is a surface emitting light source in which a light flux that has been expanded to a predetermined area depending on the degree of light diffusion of the liquid crystal layer 23 is irradiated from the upper surface of the light diffusing panel 20 toward the outside.

Note that also when the liquid crystal layer 23 of the light diffusing panel 20 is in the state of diffusing light without applying voltage, the transparent panel is similarly the surface emitting light source.

As described above, the transparent panel provided with light emitting function of the present embodiment has a structure in which the light source is incorporated, but can have three modes of the transparent state, a state of point emitting light source, and a state of surface emitting light source.

Since the transparent panel of the present embodiment uses the light diffusing panel 20 in which the liquid crystal layer 23 is sandwiched between the light transmitting substrates 21 and 22 for liquid crystal such as glass or film, it can emit uniform surface-emitting light even in a structure in which the light transmitting substrate 2 for LED mounted with the LED die 1 which is a point light source is in close contact with the light diffusing panel 20.

In the present embodiment, since the light source device 10 in which the LED die 1 is mounted on the light transmitting substrate 2 is directly bonded to the light diffusing panel 20 by using a desired method such as sticking or adhesion, it is possible to reduce loss of light between the light source device 10 and the light diffusing panel 20, thereby suppressing reduction in an amount of light extraction.

A part of the light diffused in the liquid crystal layer 23 of the light diffusing panel 20 is also diffused to the light source device 10 side, but in the present embodiment, since the wiring pattern 3 is disposed on a part of the light transmitting substrate 2 of the light source device 10, a part of diffused light diffused to the light source device 10 side can be incident on the light diffusing panel 20 again due to its reflection characteristics. Therefore, it is possible to further reduce the loss of light, thereby suppressing reduction in the amount of light extraction.

As the light transmitting substrate 2 for LED of the light source device 10, for example, a thin substrate having a thickness of 25 to 100 μm can be used. Since the LED die 1 can be mounted even on such a thin substrate 2 by electromagnetic wave sintering as in the present embodiment, the light source device 10 can be thinned. Therefore, even the transparent panel incorporating the LED die 1 can be thinned.

In the transparent panel of the present embodiment, since the light source device 10 and the light diffusing panel 20 are in close contact with each other, the light diffusing panel 20 can be warmed by the heat generated by the LED die 1 and the wiring pattern 3 of the light source device 10. Therefore, it is possible to suppress reduction in response speed of the liquid crystal of the light diffusing panel 20 even at a low temperature, thereby suppressing reduction in switching speed between a point light source state and a surface light source state.

The transparent panel of the present embodiment includes the conductive particles obtained by, for example, sintering the wiring pattern 3 by electromagnetic waves. Therefore, when forming the wiring pattern 3, it is possible to focus the electromagnetic waves to irradiate the conductive particles arranged at positions where the wiring pattern 3 on the light transmitting substrate 2 for LED is to be formed, and there is no need to apply heat to an entire surface of the transparent substrate 2 for LED. Therefore, a heating region at the time of forming the wiring pattern 3 is extremely local, about a spot diameter of the focused electromagnetic waves, and local heat can be thermally conducted to the surrounding light transmitting substrate 2 for LED, and can be dissipated in the air. If implemented by this method, temperature rise of the light transmitting substrate 2 for LED can be suppressed, and the wiring pattern 3 can be formed without damaging the light transmitting substrate 2 for LED. Therefore, resin or the like can also be used as the light transmitting substrate 2 for LED.

In the electromagnetic wave sintering, since a fine wiring pattern 3 having a large ratio (an aspect ratio) of thickness to width of wiring and an electrically low resistance can be formed by combining with sintering by heat as necessary, it is possible to reduce an area of the wiring pattern 3 covering the light transmitting substrate 2 for LED. It is possible to reduce an area of the wiring pattern 3 shielding the external light and the light from the LED die 1, and to maintain transparency of the light transmitting substrate 2 for LED. In particular, it is desirable that the wiring pattern 3 has a thickness larger than a width. Thus, it is possible to reduce the area of the wiring pattern 3 covering a display body 5, and to achieve the electrically low resistance.

The ratio of thickness to width of the wiring pattern 3 is desirably thickness/width=1/100 or more, more desirably thickness/width=5/100 or more, and particularly desirably thickness/width=10/100 or more. When supplying a large current to the wiring pattern 3, it is desirable that thickness/width=20/100 or more.

In the electromagnetic wave sintering, since the fine wiring pattern 3 can be formed by combining with sintering by heat as necessary, the LED die 1 that is not packaged can be directly bonded to the wiring pattern 3. Therefore, since the panel incorporating the small LED die 1 can be formed, it is possible to reduce an area of the LED die 1 shielding the external light, thereby providing the transparent panel that can transmit much external light. In addition, even the transparent panel incorporating the light source can be thinned.

Note that the LED die 1 may be bonded to the wiring pattern with, for example, a substance containing conductive particles newly disposed by coating or the like.

At this time, the LED die 1 is preferably bonded to the wiring pattern by electromagnetic wave sintering. The LED die 1 can be bonded to the wiring pattern 3 while suppressing the temperature rise of the light transmitting substrate 2 for LED by electromagnetic wave sintering.

By using the electromagnetic waves having a wavelength that is absorbed by a conductive particle-containing ink material used for the wiring pattern 3 and is transmitted through the light transmitting substrate 2 for LED, it is also possible to form the fine wiring pattern 3 by irradiating the electromagnetic wave without focusing the electromagnetic wave when forming the wiring pattern 3. Also in this case, since the light transmitting substrate 2 for LED transmits the electromagnetic waves, even if the entire surface is irradiated with electromagnetic waves, the light transmitting substrate itself for LED is not increased in temperature by electromagnetic wave absorption, and only the wiring pattern 3 can be heated.

When the LED die 1 and the wiring pattern 3 are bonded to each other by electromagnetic wave sintering, even if the light transmitting substrate 2 for LED is curved and strain stress is applied, it is difficult to cause breakage or peeling at the joint, and durability can be improved.

Since the wiring pattern 3 can conduct heat generated when the LED die 1 emits light and conduct the heat efficiently to the light transmitting substrate 2 for LED, heat dissipation performance of the LED die 1 can be improved.

FIG. 1(a) shows an example in which the wiring pattern 3 is formed on a surface of the light transmitting substrate 2 for LED on which the LED die 1 is mounted, however, a part of the wiring pattern 3 may be disposed on the opposite surface of the light transmitting substrate 2 for LED.

In the structure described above, the light transmitting substrate 2 for LED is preferably a light-transmitting substrate, and materials thereof include glass, PS (polystyrene), PP (polypropylene), PC (polycarbonate), PET (polyethylene terephthalate), PEN (polyethylene naphthalate), polyimide, and the like. Thickness of the light transmitting substrate 2 for LED is, for example, 25 to 100 μm.

The wiring pattern 3 includes the pattern in which the metal material such as the copper foil is bonded to the surface of the light transmitting substrate and then formed into the desired wiring shape by the etching method or the like, and plated as necessary, the pattern in which the ink containing the conductive particles and the thermosetting substance such as epoxy or silicone is formed on the light transmitting substrate, and cured into the desired wiring shape by heating or the like, or the pattern in which the ink containing the conductive particles and the solvent or the dispersant is formed on the light transmitting substrate, and sintered by heat or electromagnetic waves. As the conductive particles, one or more of conductive metals and conductive metal oxides such as Au, Ag, Cu, Pd, ITO, Ni, Pt, and Fe can be used. In order to efficiently perform the sintering using electromagnetic waves, it is desirable to improve electromagnetic wave absorption properties of the ink containing the conductive particles, and it is desirable that some or all of the conductive particles have a nano-sized shape. Size of the contained particles is, for example, 10 to 150 nm.

As the LED die 1, one emitting the light of desired wavelength suitable for visibility improvement is used.

<<Method for Manufacturing Transparent Panel Provided with Light Emitting Function>>

<Method for Manufacturing Light Source Device 10>

Next, a method for manufacturing the transparent panel provided with light emitting function of the first embodiment will be described. First, a process for manufacturing the light source device 10 will be described with reference to FIG. 2(a) to FIG. 2(d). Here, an example will be described in which the wiring pattern 3 is formed by sintering the ink containing conductive particles and the solvent or the dispersant using light that is the electromagnetic wave.

First, as shown in FIG. 2(a), solution (ink) in which the conductive particles and an insulating material are dispersed, or solution in which the conductive particles coated with an insulating material layer are dispersed is prepared, and is coated on the surface of the transparent substrate 2 for LED in a desired shape. As a coating method, a method such as ink jet, dispensing, flexo, gravure, gravure offset, or screen printing can be used. Thus, a film 121 of the conductive particles coated with the insulating material is formed on the surface of the light transmitting substrate 2 for LED. The film 121 is heated as necessary to be dried by evaporating the solvent. Conductive nanoparticles are dispersed in the film 121, and circumference of the conductive nanoparticles is covered with the insulating material. Therefore, in this step, the film 121 is non-conductive when the conductive nanoparticles are completely covered with the insulating material, but has conductivity when it also has a portion not covered with the insulating material. That is, the conductivity can be controlled by type and an addition amount of the insulating material. The film 121 may be applied to have a shape of the wiring pattern 3 to be formed, or may be a uniform film. In the case of the uniform film, a region other than the wiring pattern 3 is removed in a subsequent step.

In order to sinter fine particles of the formed unsintered film 121, only a wiring portion is locally heated by irradiating electromagnetic waves, to sinter the fine particles. As the electromagnetic wave, a pulse wave of light like a flash lamp, a continuous wave such as a laser beam, or an electromagnetic wave with a long wavelength such as microwave can be used. Here, first, as shown in FIG. 2(b), the LED die 1 is mounted on the unsintered wiring pattern 3 so that an electrode 31a thereof contacts the film 121. Next, as shown in FIG. 2(c) and FIG. 2(d), the film 121 is irradiated with a light flux 12 through the light transmitting substrate 2 for LED. In this method, for example, formation of the wiring pattern 3 and connection between the LED die 1 and the wiring pattern 3 can be performed simultaneously or successively by irradiation with the light flux 12. Specifically, as shown in FIG. 2(c), by irradiating the light flux 12 to a region between the electrode 31a and the light transmitting substrate 2 for LED from a side where the film 121 is not formed of the light transmitting substrate 2 for LED, the conductive particles of the film 121 are sintered by electromagnetic wave, to form the wiring pattern 3 serving as an electrode connection region. Further, as shown in FIG. 2(d), the light flux 12 is also irradiated to form other wiring patterns 3, too. As for formation order, the wiring pattern 3 serving as the electrode connection region of the LED die 1 may be formed after the other wiring patterns are formed.

After the wiring pattern 3 is formed, unsintered conductive particle-containing ink is further applied between the wiring pattern 3 and the electrode 31a, and the electrode 31a of the LED die 1 is mounted, and then it is also possible to form the electrode connection region by further irradiating the light flux 12.

In a region of the film 121 irradiated with the light flux 12, the conductive particles absorb light energy so that the temperature is increased. Thus, the conductive particles melt at a temperature lower than a bulk melting point of materials constituting the particles, and with the increase in the temperature of the conductive particles, much of the surrounding insulating material layer evaporates, and some of them remain and are softened. Therefore, the melted conductive nanoparticles fuse directly with adjacent particles, or break through the softened insulating material layer, to fuse with the adjacent particles. Thus, the conductive particles are sintered to each other, so that the conductive wiring pattern 3 is formed on an upper surface of the light transmitting substrate 2 for LED. At this time, the melted conductive particles are fixed to the light transmitting substrate 2 for LED. In particular, by irradiating the light flux 12 from the surface of the light transmitting substrate 2 for LED on which the film 121 is not formed, it is possible to increase fixing strength of an interface between the light transmitting substrate 2 for LED and the wiring pattern 3.

As described above, the temperature of the conductive particles in the region of the film 121 that has been irradiated with the light flux 12 is increased by being irradiated with light, and this heat is used for sintering of the conductive particles, and is conducted to the surrounding film 121 and the light transmitting substrate 2 for LED, to be dissipated. Therefore, only the region of the film 121 irradiated with the light flux 12 or only the region irradiated with the light flux 12 and its neighboring region reach a temperature at which the conductive particles are sintered, and temperatures of the film 121 in its outer region and the light transmitting substrate 2 for LED do not reach a temperature at which materials constituting them are melted or altered. That is, in the present embodiment, it is possible to suppress the temperature rise of the light transmitting substrate 2 for LED by irradiating only a partial region of the film 121 with the light flux 12, and to prevent the light transmitting substrate 2 for LED from being deformed, distorted or altered, for example, cloudy due to the electromagnetic wave sintering.

Further, when the light transmitting substrate 2 for LED is flexible, the flexibility can be maintained.

In steps of FIG. 2(c) and FIG. 2(d), it is desirable to form the wiring pattern 3 to be porous. That is, it is desirable that the adjacent conductive particles are not completely melted to be mixed as a whole, but are sintered at a contact interface, and the electromagnetic wave sintering is performed at a temperature at which pores are formed in at least a part between the conductive particles after sintering. For example, the laser beam is used as the light flux 12 and the film 121 is irradiated with an irradiation intensity that does not melt the light transmitting substrate 2 for LED through which the laser beam is transmitted, so that relatively large amount of energy can be input into the region of the film 121 irradiated with the light flux 12 in a short time, and the conductive particles can be heated and melted to be sintered. At the same time, by stopping the irradiation of the light flux 12 of the laser beam, it is possible to quickly cool the wiring pattern by heat conduction to the surrounding film 121 and the light transmitting substrate 2 for LED, thereby forming a porous wiring pattern. In other words, when the film 121 is sintered with the light flux 12 of the laser beam, the porous wiring pattern 3 can be formed by adjusting the irradiation intensity of the light flux 12 so that the film 121 has an appropriate temperature. As a specific example, a stretched polyethylene terephthalate (PET) film (melting point: about 250° C., heatproof temperature: about 150° C.) is used as the light transmitting substrate 2 for LED. When the intensity of the light flux 12 of the laser beam is adjusted so that a shape of the light transmitting substrate 2 for LED is maintained, and the film 121 is irradiated from a back surface of the light transmitting substrate 2 for LED, and the conductive particles of the film 121 are sintered, the porous wiring pattern 3 can be formed.

When the wiring pattern 3 is porous, the wiring pattern 3 itself has followability (flexibility) as described above, and even when the flexible light transmitting substrate 2 for LED is deformed, the wiring pattern 3 follows the deformation. Therefore, the wiring pattern 3 is not easily peeled off from the light transmitting substrate 2 for LED and cracks and the like are not easily generated. Thus, it is possible to provide the flexible substrate 2 that is less likely to cause disconnection.

In the steps of FIG. 2(c) and FIG. 2(d), the light flux 12 may be irradiated after the light flux 12 when irradiating the film 121 is shaped into the shape of the wiring pattern 3 by being passed through a mask, or the wiring pattern 3 may be drawn by scanning the light flux 12 whose irradiation spot is circular or rectangular.

When the sealing resin layer 4 is provided around the LED die 1 in order to protect the LED die 1, an uncured sealing resin is filled around the LED die 1 by a desired method, and is then cured by a desired method such as heat or UV. Further, another light transmitting substrate is disposed to face the light transmitting substrate 2 with the LED die 1 interposed therebetween, and a gap between the two light transmitting substrates is filled with resin by capillary action or vacuum injection technique, and then it can also be cured by a desired method. As the sealing resin layer 4, a light transmitting resin material such as an epoxy resin, a silicone resin, a urethane resin, or an acrylic resin is used.

Through the above steps, the light transmitting substrate 2 for LED on which the wiring pattern 3 and the LED die 1 are mounted, that is, the light source device 10 can be manufactured.

Figure 2:
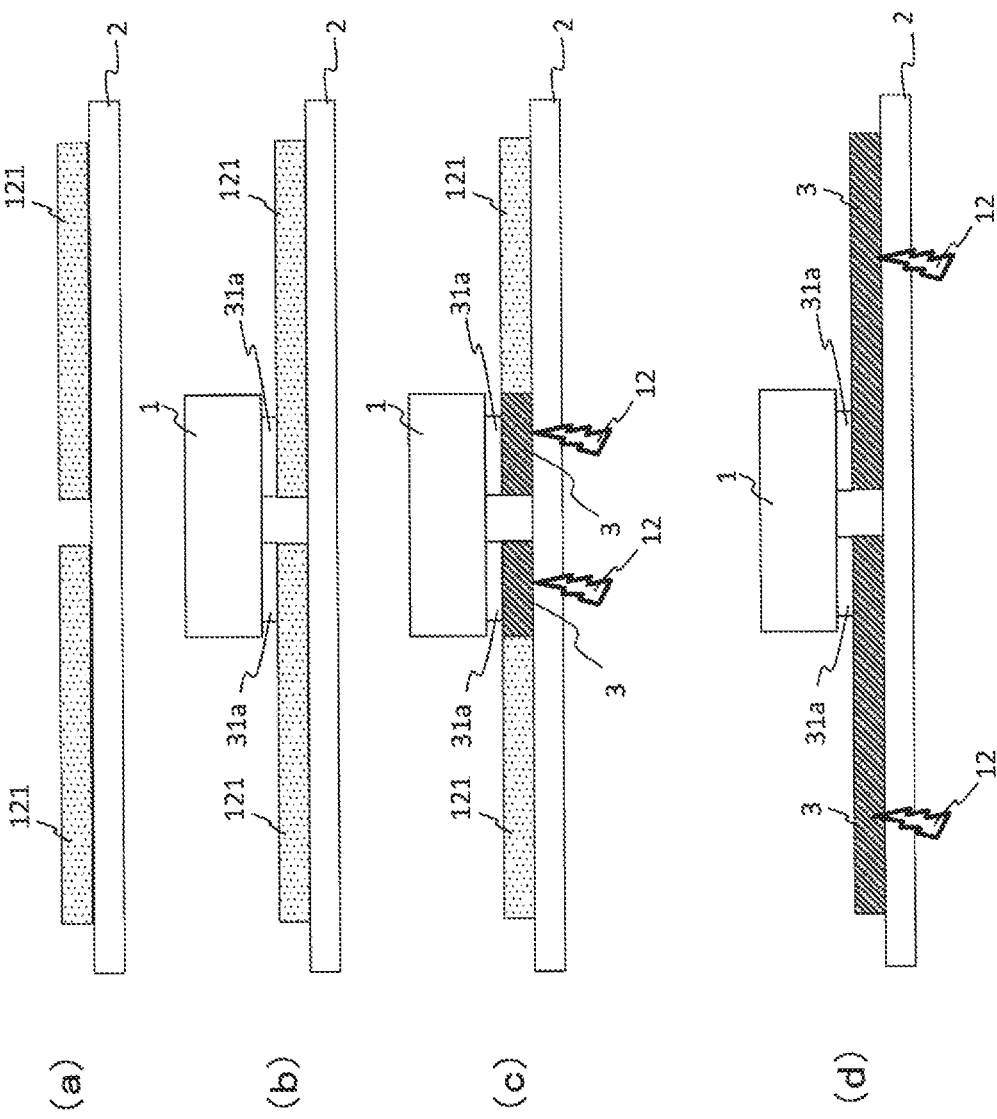
FIG. 2(*a*) to FIG. 2(*d*) are cross-sectional views showing a process for manufacturing a light source device of the transparent panel of the first embodiment.

In the manufacturing process of FIG. 2, it is of course possible to irradiate the light flux 12 from the surface of the light transmitting substrate 2 for LED on which the film 121 is provided. In this case, the electromagnetic wave sintering cannot be used for a connection portion of the electrode on which the LED die 1 is mounted, however, since the other wiring pattern 3 can be sintered, the steps of forming the electrode connection portion and the wiring pattern can also be performed in parallel.

Note that the wavelength of the light flux 12 to be irradiated is a wavelength that is absorbed by the conductive particles contained in the film 121. The light to be irradiated may be ultraviolet, visible, or infrared light, or may be microwave. For example, when Ag, Cu, Au, Pd, or the like is used as the conductive particles, visible light of 400 to 600 nm can be used.

If there is a region of the film 121 that is not irradiated with light, sintering does not occur in the region and the film 121 is removed in a subsequent step. For example, the film 121 can be removed using an organic solvent or the like. Further, the film 121 can also be sintered by additionally irradiating light or heating.

The ink containing conductive fine particles used in the step of forming the wiring pattern 3 is a solution in which nano-sized conductive particles of 1 µm or less and an insulating material are dispersed, or a solution in which the conductive particles coated with the insulating material layer are dispersed. As the conductive particles, one or more of conductive metals and conductive metal oxides such as Au, Ag, Cu, Pd, ITO, Ni, Pt, and Fe can be used. The conductive particles may be only nanoparticles having a particle diameter of less than 1 µm, or nanoparticles of less than 1 µm and microparticles of 1 µm or more may be mixed. As the solvent of the solution, the organic solvent or water is used. Additives (polymer component or the like) that improve dispersibility may be added to the solvent, or resin components (epoxy, silicone, urethane or the like) may be added to improve adhesive force.

As the insulating material contained at least in the film 121 or the insulating material coating the conductive particles of the film 121, one or more of organic materials such as styrene resin, epoxy resin, silicone resin, and acrylic resin, inorganic materials such as $SiO_2$, $Al_2O_3$ and $TiO_2$, and organic and inorganic hybrid materials can be used. Although a preferable thickness of the insulating material layer coating the conductive particles in the film 121 varies depending on conductivity control, the thickness is preferably about 1 nm to 10 µm, for example, in the case of having insulating properties.

The wiring pattern 3 can be formed to have a size of, for example, 1 µm or more and a thickness of about 1 nm to 50 µm. Electrical resistivity of the wiring pattern 3 is preferably $10^{-4}$ Ω·cm or less, and particularly preferably a low resistance on the order of $10^{-6}$ Ω·cm.

<Method for Manufacturing Light Diffusing Panel 20>

As the light transmitting substrates 21 and 22 for liquid crystal, the light transmitting substrates, such as glass, PET (polyethylene terephthalate), PEN (polyethylene naphthalate), polyimide, PS (polystyrene), PP (polypropylene), or PC (polycarbonate) can be used. The transparent conductive films 24 and 25 are formed of a transparent conductive material using a metal oxide such as ITO (Indium Tin Oxide), or are formed of a mesh wiring of a conductive metal such as Ag or Cu. A film formed of a polyimide-based material is disposed as an alignment film on a surface on the liquid crystal layer 23 side of the light transmitting substrates 21 and 22 for liquid crystal. A sealing resin layer 26 that seals a periphery of the light transmitting substrates 21 and 22 for liquid crystal while maintaining the gap thereof is formed of epoxy, silicone, acrylic resin, or the like.

As the light transmitting substrates 21 and 22 for liquid crystal, for example, glass (blue plate glass) is prepared in which one surface is polished, a $SiO_2$ undercoat is applied to the surface, and the transparent conductive films 24 and 25 made of ITO are formed on the surface. Then, the transparent conductive films 24 and 25 are processed into a desired pattern. For example, it is processed by a photolithography process and an etching process. If necessary, an insulating layer such as $SiO_2$ may be formed on a part of a surface of the transparent conductive films 24 and 25 made of ITO. In the case where the transparent conductive films 24 and 25 are formed by metal mesh wiring, the mask may be disposed on the metal film formed on the light transmitting substrates 21 and 22 for liquid crystal, and the metal film may be processed into a mesh shape by the photolithography process and the etching process, to form the transparent conductive films 24 and 25 of metal mesh wiring. Further, the metal film for forming the metal mesh wiring may be formed by being directly coated on the light transmitting substrates 21 and 22 for liquid crystal in the desired pattern. As the coating method, the method such as ink jet, dispensing, flexo, gravure, gravure offset, or screen printing can be used. By this method, it is also possible to directly form a mesh-like metal film. Note that surface treatment for improving adhesiveness of the light transmitting substrates 21 and 22 for liquid crystal with the metal film may be performed before coating. For example, the surface treatment is performed by plasma treatment, UV treatment, coupling treatment or the like.

After the glass substrates 21 and 22 are washed with an alkaline solution or the like as necessary, an alignment film material is applied to the glass substrates by the flexographic printing method or the like, and then sintered at a desired temperature and time in a clean oven to be formed into the alignment film.

Next, a rubbing treatment is applied to the alignment films of the substrates 21 and 22 as necessary using a cotton rubbing cloth. The rubbing treatment may not be necessarily performed. One substrate is sprayed over the entire surface with glass or plastic spacers (gap control balls) having a desired particle diameter, for example, by a dry spraying method. An edge of the other substrate is coated in a desired pattern with a thermosetting sealing material (sealing resin 26) mixed with rod-shaped glass or plastic spacer having a desired particle diameter by a dispenser or the like. Thereafter, two substrates are bonded together so that electrode surfaces thereof face each other, and the sealing resin 26 is formed by curing the sealing material by thermocompression bonding or the like, to complete an empty cell. Here, the gap control ball is used to maintain the thickness of the liquid crystal layer 23, however, resin columnar spacers may be formed on the transparent conductive films 24 and 25 in advance.

The gap between the formed empty cell substrates 21 and 22 is injected with, for example, a liquid crystal material by a vacuum injection method, it is sealed while being pressed, and burned at a desired temperature and time. Thus, a liquid crystal cell is formed.

Although the method of vacuum injection after forming the empty cell has been described here, other methods such as a liquid crystal dropping method (ODF method) can also be used. For example, in the ODF method, the sealing material and the liquid crystal material are formed on one substrate, and the liquid crystal cell is formed by press treatment, heat treatment, UV treatment, or the like while the other substrate is bonded.

Finally, lead frames are attached to electrode lead terminals of the transparent conductive films 24 and 25 of the liquid crystal cell. Thus, the light diffusing panel 20 is completed. Note that the lead frames may be attached after the light diffusing panel 20 and the light source device 10 are bonded together.

<Bonding Step of Light Source Device and Light Diffusing Panel>

One or both of the light source device 10 and the light diffusing panel 20 is formed with a light transmitting resin layer, and both are bonded together. They may be bonded together after being heated such that desired curing conditions or softening conditions are satisfied. As the light transmitting resin layer, epoxy, acrylic, silicone, polycarbonate, polystyrene, PET, PEN, polyimide, or the like can be used. As a method for forming the light transmitting resin layer, in addition to the coating method and the printing method, a method can be used in which the light source device 10 and the light diffusing panel 20 are opposed to each other with a minute gap, and the resin is filled in the gap by capillary action or vacuum injection technique, and then the resin is cured by a desired method as necessary.

As a method other than bonding by resin curing, an adhesive film having optical transparency is bonded to one or both of the light source device 10 and the light diffusing panel 20, and then the light source device 10 and the light diffusing panel 20 may be bonded together by the adhesive film.

The bonding step may be performed in a batch manner, and when the light transmitting substrates 2, 21 and 22 of the light source device 10 and the light diffusing panel 20 are all flexible, the bonding step may be performed in a laminating manner, or a roll-to-roll manner.

The light source device 10 and the light diffusing panel 20 can be fixed using a method other than a method using the light transmitting resin. For example, the light source device 10 and the light diffusing panel 20 may be fixed by using a non-light transmitting resin and by bonding the resin around the device or in a fine area. Further, the light source device 10 and the light diffusing panel 20 may be mechanically fixed by fitting such as screwing, caulking, or hooking.

Second Embodiment

Figure 3:
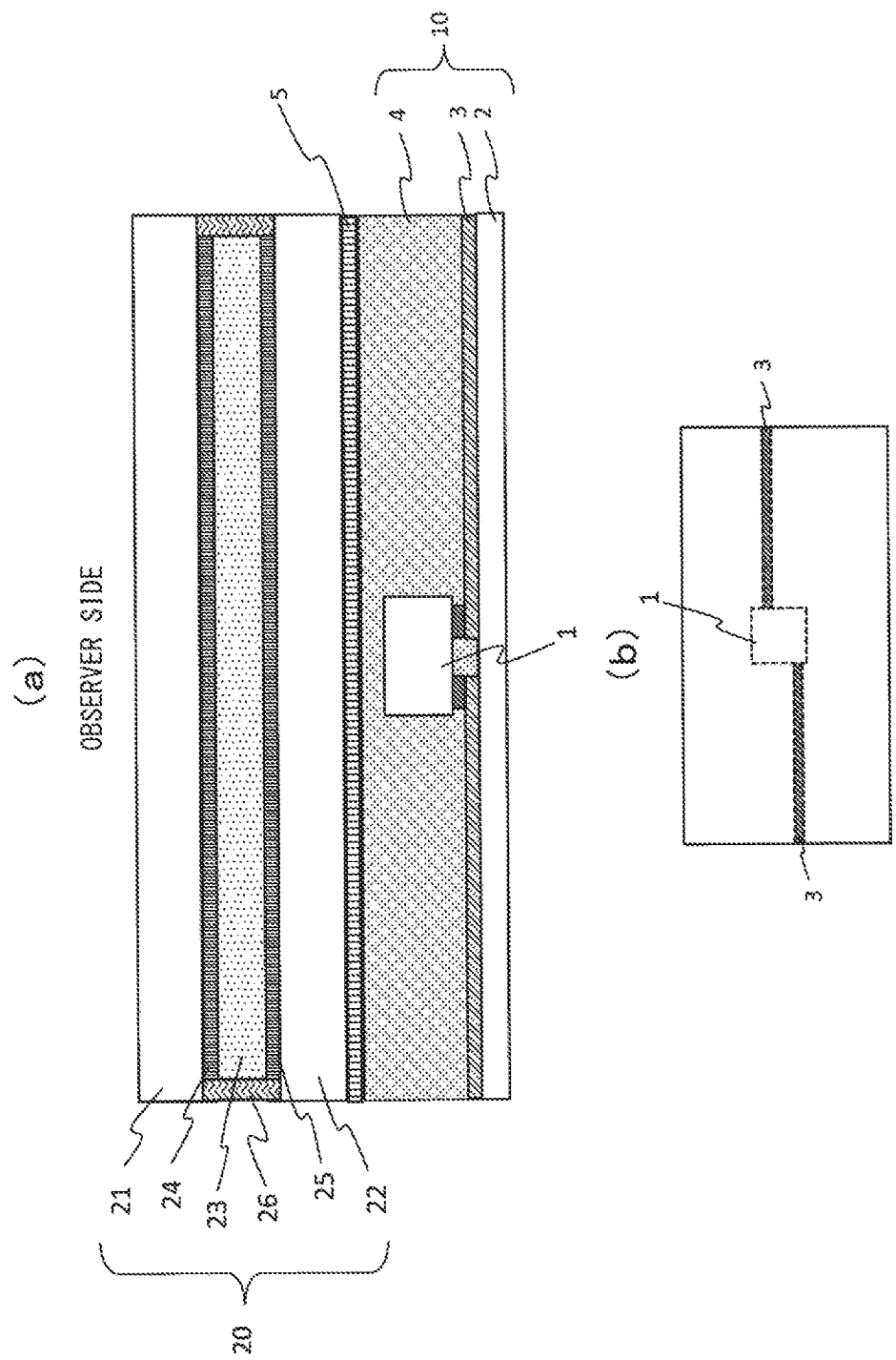
FIG. 3(*a*) is a cross-sectional view of the transparent panel provided with light emitting function of a second embodiment, and FIG. 3(*b*) is a top view thereof.

The transparent panel provided with light emitting function of a second embodiment will be described with reference to FIG. 3(*a*) and FIG. 3(*b*). FIG. 3(*a*) and FIG. 3(*b*) are a cross-sectional view and a top view of the transparent panel provided with light emitting function of the second embodiment.

As shown in FIG. 3(*a*), in the present embodiment, a direction of the light source device 10 is opposite to that of the first embodiment, and a surface of the sealing resin layer 4 is in close contact with and fixed to the light diffusing panel 20. A light emitting direction of the LED die 1 is also opposite to that of the first embodiment, and the LED die 1 is mounted on the light transmitting substrate 2 for LED so as to emit light toward the surface of the sealing resin layer 4. The light source device 10 may be in close contact with the light diffusing panel 20 using a material of the sealing resin layer 4, or may be in close contact with the light diffusing panel 20 by providing an adhesive layer on the surface of the sealing resin layer 4 after the light source device is manufactured. Or, it may be mechanically fixed to the light diffusing panel 20 by fitting such as screwing, caulking, or hooking.

Other structures and operations of the transparent panel provided with light emitting function of the present embodiment are the same as those of the first embodiment, and the transparent panel is switchable between a state transparent to the external light, a point light emitting state, and a surface light emitting state.

Third Embodiment

Figure 4:
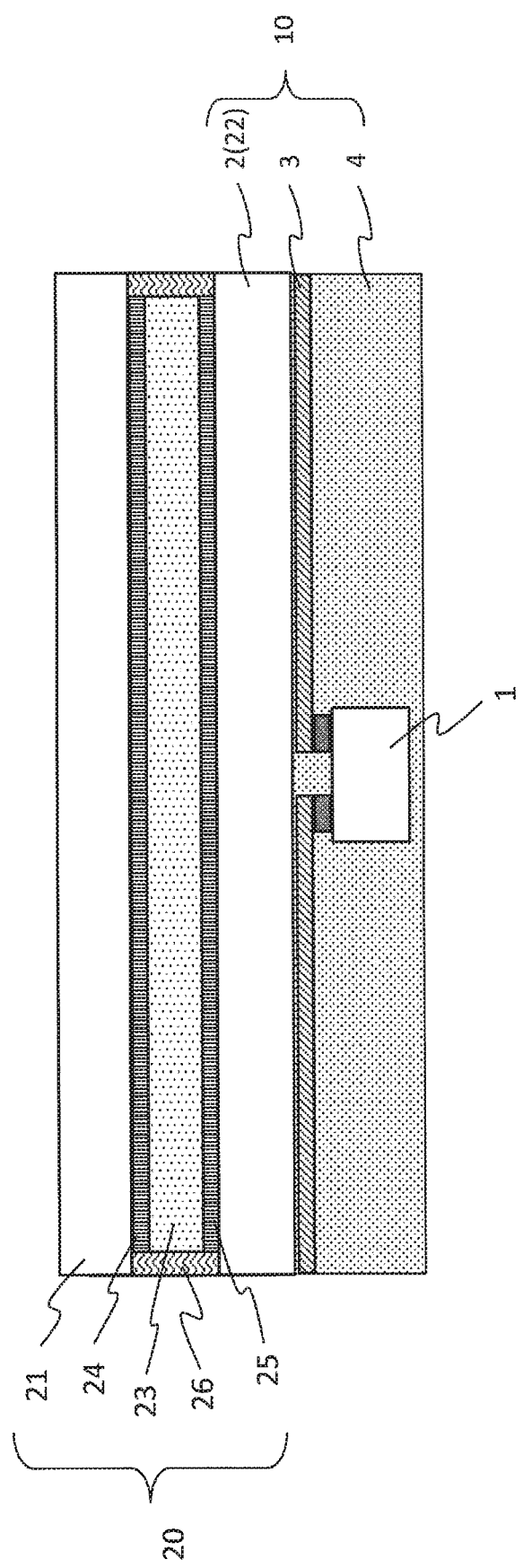
FIG. 4 is a cross-sectional view of the transparent panel provided with light emitting function of a third embodiment.

The transparent panel provided with light emitting function of the third embodiment will be described with reference to FIG. 4. FIG. 4 is a cross-sectional view of the transparent panel provided with light emitting function of the third embodiment.

As shown in FIG. 4, in the present embodiment, the light transmitting substrate 2 for LED also serves as the light transmitting substrate 22 for liquid crystal. The dual-purpose light transmitting substrate 2 (22) has one surface in contact with the liquid crystal layer 23, and the other surface mounted with the LED die 1 and the wiring pattern 3. Other structures are the same as those of the first embodiment, and thus description thereof will be omitted.

The transparent panel provide with the light emitting function of the present embodiment can achieve the same operation and effect as those of the first embodiment, and the LED light transmitting substrate 2 and the liquid crystal light transmitting substrate 22 are one substrate, and thus there is an advantage that it can be made thinner than the transparent panel of the first embodiment. Moreover, material cost can also be reduced.

As the method for manufacturing the transparent panel provided with light emitting function of the present embodiment, after the wiring pattern 3 and the LED die 1 are mounted on the dual-purpose light transmitting substrate 2 (22) by the steps of FIG. 2(*a*) to FIG. 2(*d*), the alignment film may be formed on the surface on which the LED die 1 is not mounted, and a step of assembling the light diffusing panel 20 may be performed.

It is not limited to this method, but another manufacturing process may be performed. First, before the LED die 1 is mounted on the light transmitting substrate, the light diffusing panel 20 is assembled using the dual-purpose light transmitting substrate 2 (22). Thereafter, the wiring pattern 3 and the LED die 1 are mounted on the surface of the light transmitting substrate 2 (22) by the steps of FIG. 2(*a*) to FIG. 2(*d*). At this time, when the light flux 12 is irradiated in the step of FIG. 2(*c*), the electromagnetic wave sintering may be performed by irradiating the light flux 12 through the transparent light diffusing panel 20 in a state where the liquid crystal layer 23 is made transparent by applying the voltage from the transparent conductive films 24 and 25. Thus, the wiring pattern 3 can be irradiated with electromagnetic waves through the substrate 2 (22) and sintered. Note that when the liquid crystal layer is in the transparent state without applying the voltage, the sintering using electromagnetic waves can be performed without applying the voltage.

Fourth Embodiment

Figure 5:
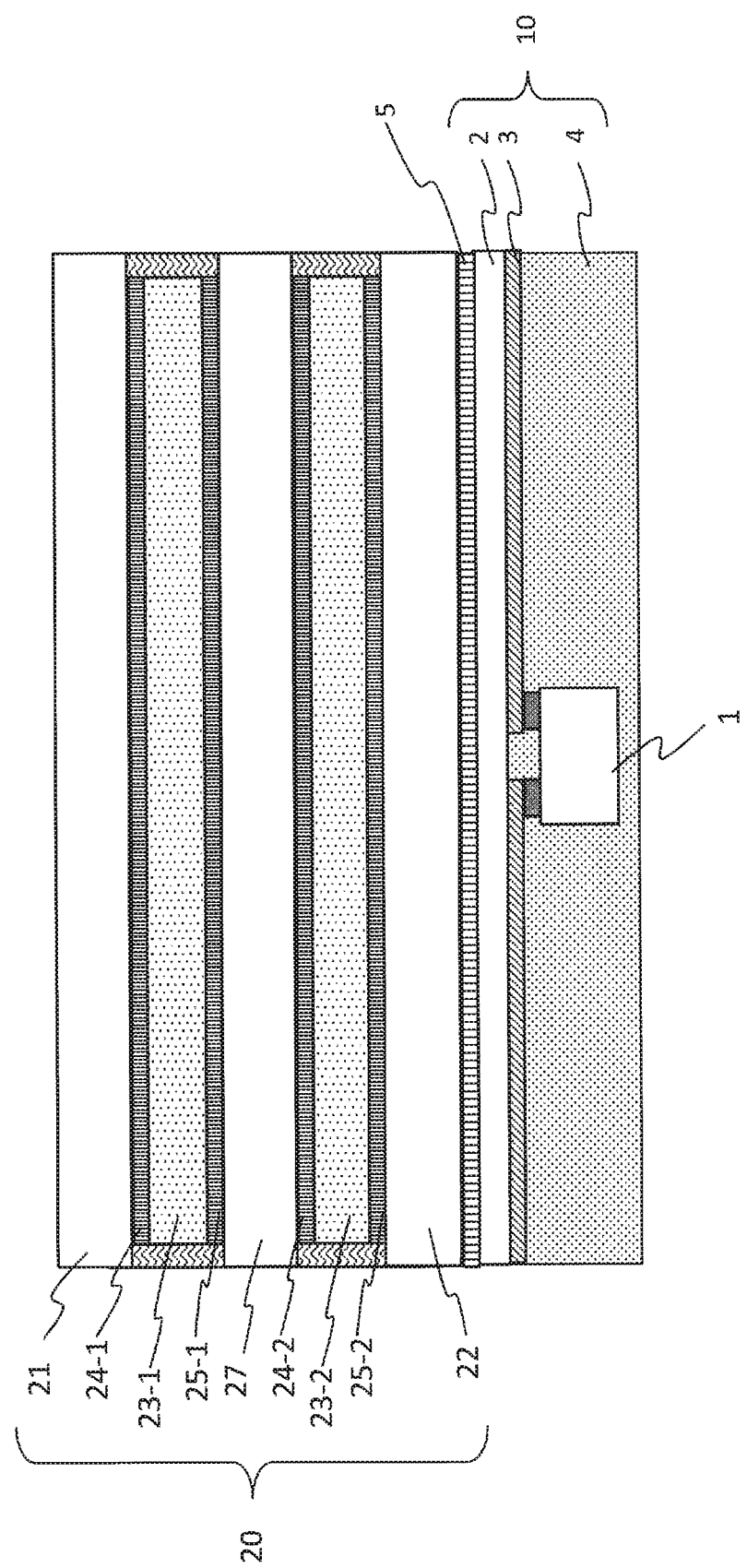
FIG. 5 is a cross-sectional view of the transparent panel provided with light emitting function of a fourth embodiment.

The transparent panel provided with light emitting function of a fourth embodiment will be described with reference to FIG. 5. FIG. 5 is a cross-sectional view of the transparent panel provided with light emitting function of the fourth embodiment.

As shown in FIG. 5, the present embodiment is different from the first embodiment in that the light diffusing panel 20 has a structure including two liquid crystal layers. A light transmitting substrate 27 for liquid crystal is disposed between the two liquid crystal layers 23-1 and 23-2. Further, transparent conductive films 24-1 and 25-1 are arranged to sandwich the liquid crystal layer 23-1, and transparent conductive films 24-2 and 25-2 are arranged to sandwich the liquid crystal layer 23-2.

As in the first embodiment, the light source device 10 is disposed so that the light transmitting substrate 2 for LED is in close contact with the light diffusing panel 20.

In the present embodiment, the liquid crystal layers 23-1 and 23-2 are provided in two layers, and the voltage is applied from the transparent conductive films 24-1 and 25-1 and the transparent conductive films 24-2 and 25-2, so that both are in the light diffusion state. Thus, the light emitted from the LED die 1 can be diffused in two stages, so that more uniform surface-emitting light can be realized. Further, by doubling layer thickness while keeping one liquid crystal layer, the same diffused light uniformity as in the case of using two layers can be obtained, however, drive voltage applied from the transparent conductive film is increased. The present embodiment has an advantage that the diffused light uniformity can be improved without increasing the drive voltage by using the two liquid crystal layers.

In the case where the liquid crystal layer is transparent without applying the voltage, if the layer thickness is doubled while keeping one liquid crystal layer, the drive voltage for making the layer transparent is increased.

Other structures and effects are the same as those of the first embodiment, and thus description thereof will be omitted.

Figure 6:
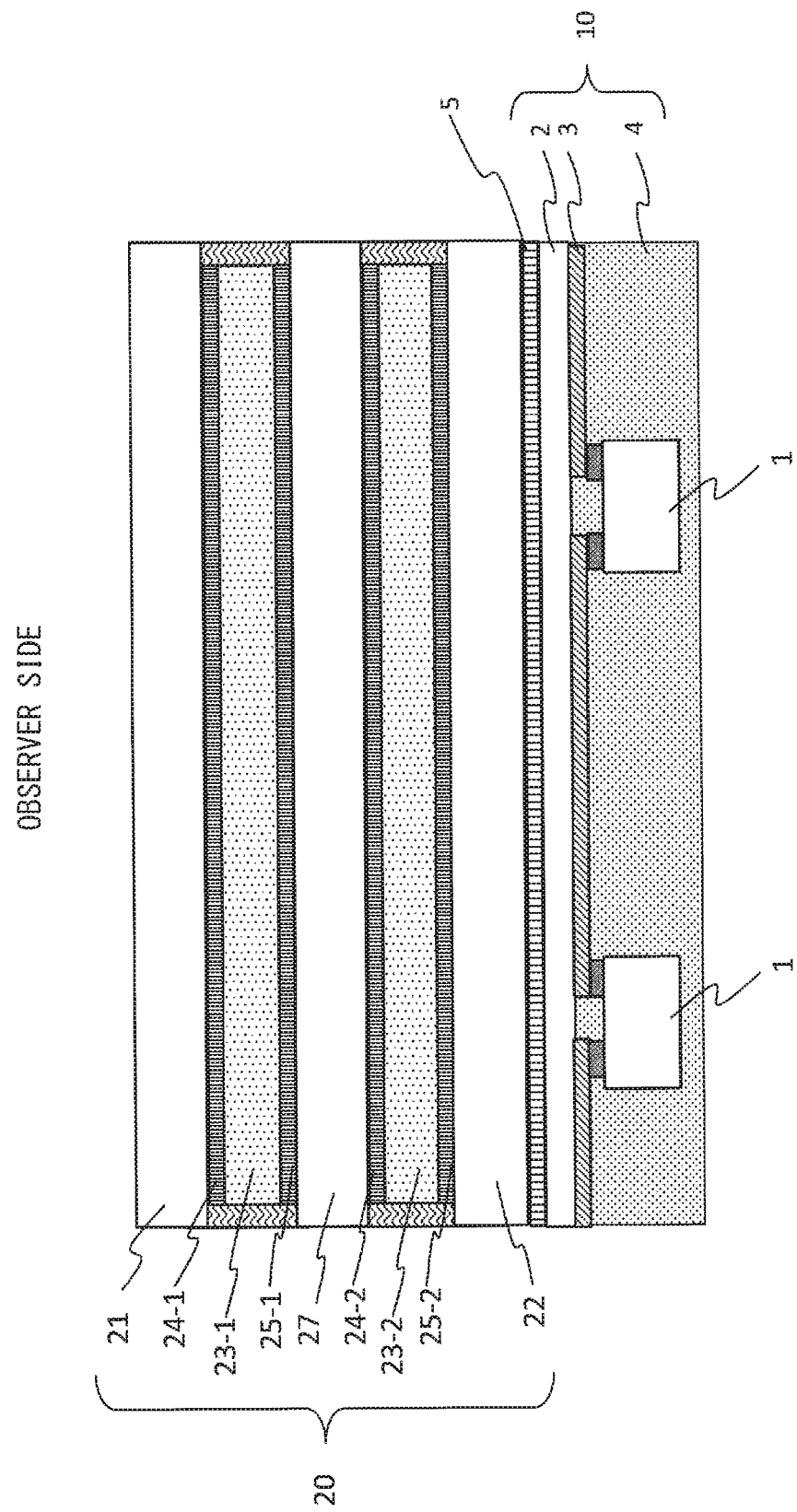
FIG. 6 is a cross-sectional view of another example of the transparent panel provided with light emitting function of the fourth embodiment.

The number of LED dies 1 mounted on the light source device 10 is not limited to one, but two or more LED dies 1 can be mounted as shown in FIG. 6. By using a plurality of LED dies 1, it is possible to irradiate light that is uniformly diffused over a wider area than in the case of one LED die 1.

Note that the direction of the light source device 10 of the transparent panel of the present embodiment may be reversed as shown in FIG. 3 of the second embodiment, and an upper surface of the sealing resin layer 4 may be in close contact with the light diffusing panel 20.

Fifth Embodiment

Figure 7:
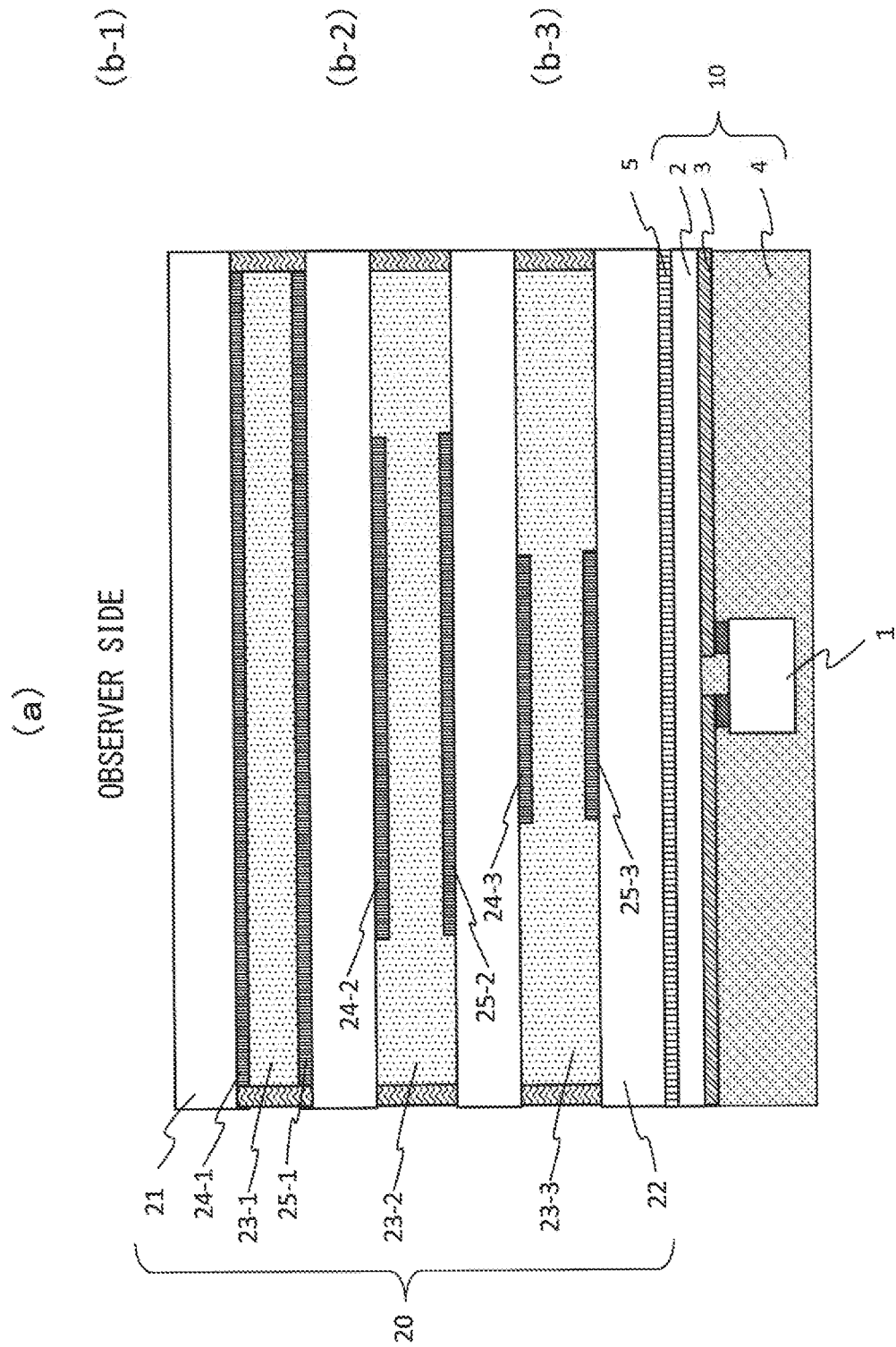
FIG. 7(*a*) is a cross-sectional view of the transparent panel provided with light emitting function of a fifth embodiment, and FIG. 7(*b*-1) to FIG. 7(*b*-3) are explanatory diagrams showing intensity distributions of emitted light flux.

The transparent panel provided with light emitting function of a fifth embodiment will be described with reference to FIGS. 7 and 8. FIG. 7(*a*) and FIG. 8(*a*) are cross-sectional views of the transparent panel provided with light emitting function of the fifth embodiment. FIG. 7(*b*) and FIG. 8(*b*) are front views showing intensity distributions of the light flux emitted from the light diffusing panel 20.

In the fifth embodiment, the light diffusing panel 20 includes two or more (three layers here) liquid crystal layers 23-1 to 23-3, and the transparent conductive films 24-1 and 25-1, 24-2 and 25-2, 24-3 and 25-3 are respectively arranged to sandwich the liquid crystal layers.

In the present embodiment, sizes of the transparent conductive films 24-1, 25-1, 24-2, 25-2, 24-3 and 25-3 respectively arranged in the liquid crystal layers 23-1, 23-2, and 23-3 are different from each other. Thus, regions where the diffusion state and the transparent state are switched by the drive voltage applied by the transparent conductive films are made different respectively for the liquid crystal layers 23-1 to 23-3.

Specifically, in an example of FIG. 7(a), the transparent conductive films are all circular, and the transparent conductive films 24-3 and 25-3 of the liquid crystal layer 23-3 closest to the LED die 1 are the smallest, and the transparent conductive films 24-2, 25-2 and the transparent conductive films 24-1, 25-1 are sequentially larger as they are away from the LED die 1.

In the case where the liquid crystal layer is transparent when the voltage is applied thereto, when the voltage for bringing the liquid crystal layer 23-3 into the light diffusion state is supplied from the transparent conductive films 24-3 and 25-3 of the liquid crystal layer 23-3 closest to the LED die 1, and the voltage for bringing the liquid crystal layers 23-2 and 23-1 into the transparent state is supplied from the transparent conductive films 24-2, 25-2, 24-1, 25-1 of the other liquid crystal layers 23-2 and 23-1 are supplied, the light flux emitted from the LED die 1 is diffused only in areas (24-3, 25-3) where the transparent conductive films of the liquid crystal layer 23-3 are present, so that the diffused light having a light flux diameter is emitted from the upper surface of the light diffusing panel 20 as shown in FIG. 7(b-3).

On the other hand, when the voltages are respectively supplied from the transparent conductive films 24-3, 25-3, 24-2 and 25-2 so that the two liquid crystal layers 23-3 and 23-2 close to the LED die 1 are in the light diffusion state, and the voltage is supplied from the transparent conductive films 24-1 and 25-1 so that the liquid crystal layer 23-1 farthest from the LED die 1 is in the transparent state, the light flux emitted from the LED die 1 is diffused in two layers of transparent electrode areas (24-3, 25-3) of the liquid crystal layer 23-3 and transparent electrode areas (24-2, 25-2) of the liquid crystal layer 23-2, so that the diffused light having a larger flux diameter than that in FIG. 7(b-3) is emitted from the upper surface of the light diffusing panel 20 as shown in FIG. 7(b-2).

Further, when the voltages for bringing the liquid crystal layers 23-1 to 23-3 into the light diffusion state are respectively supplied from the transparent conductive films 24-1, 25-1, 24-2, 25-2, 24-3 and 25-3 of all the three liquid crystal layers 23-1 to 23-3, the light flux emitted from the LED die 1 is diffused in the transparent electrode areas (24-1, 25-1, 24-2, 25-2, 24-3 and 25-3) of the three liquid crystal layers 23-1 to 23-3, so that the diffused light having a further larger flux diameter than that in FIG. 7(b-2) is emitted from the upper surface of the light diffusing panel 20 as shown in FIG. 7(b-1).

As described above, in the present embodiment, by making different the region in which the diffusion state and the transparent state are switched for each of the liquid crystal layers 23-1 to 23-3, to switch each liquid crystal layer between the diffusion state and the transparent state, the diameter of the emitted light flux can be changed.

By making the sizes of the transparent conductive films 24-3 and 25-3 of the liquid crystal layer 23-3 closest to the LED die 1 smaller than the diameter of the light flux emitted from the LED die 1, it is possible to emit the light flux with gradation of intensity distribution in which its central portion is diffused and its peripheral portion is not diffused. By designing the sizes of the transparent conductive films of the liquid crystal layers 23-2 and 23-1, it is possible to emit the light flux with more complicated gradation. Thus, design properties of the emitted light flux can be expected to be improved.

In the example of FIG. 7(a), the transparent conductive films 24-1, 25-1, 24-2, 25-2, 24-3 and 25-3 of the three liquid crystal layers 23-1 to 23-3 are all arranged around an optical axis of the LED die 1, however, they are not limited to this arrangement.

Figure 8:
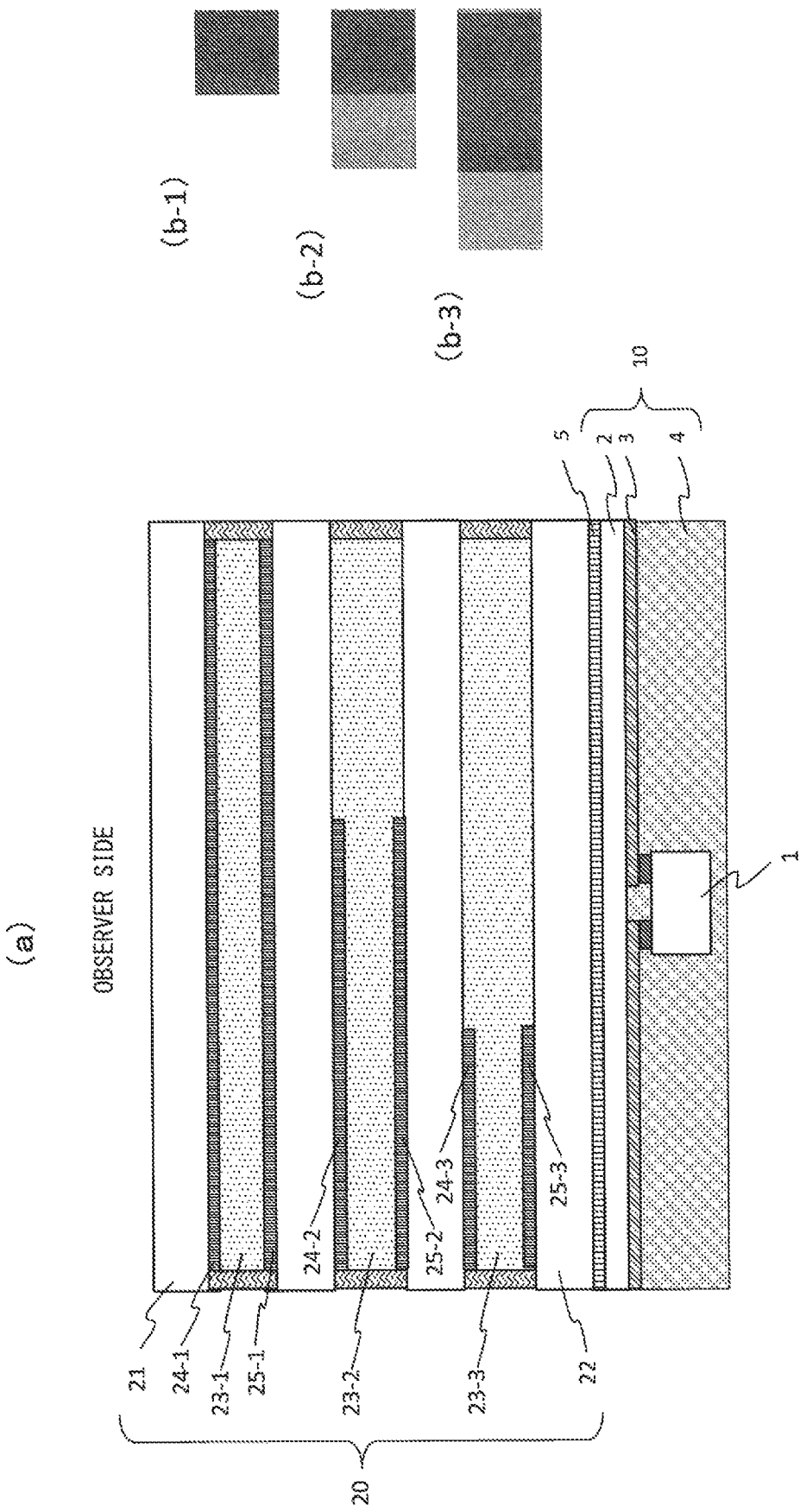
FIG. 8(*a*) is a cross-sectional view of the transparent panel provided with light emitting function of the fifth embodiment, and FIG. 8(*b*-1) to FIG. 8(*b*-3) are explanatory diagrams showing intensity distributions of emitted light flux.

FIG. 8(a) is an example in which the transparent conductive films 24-1, 25-1, 24-2, 25-2, 24-3 and 25-3, which are all rectangular and have different sizes, are arranged close to one side of the liquid crystal layers 23-1 to 23-3. FIG. 8(b-1) is the emitted light flux when the voltage is applied from the transparent conductive films 24-3 and 25-3 so that only the transparent electrode areas (24-3, 25-3) of the liquid crystal layer 23-3 of FIG. 8(a) is in the diffusion state. FIG. 8(b-2) is the emitted light flux when the voltages are applied from the transparent conductive films 24-2, 25-2, 24-3 and 25-3 so that the transparent electrode areas (24-2, 25-2) of the liquid crystal layer 23-2 and the transparent electrode areas (24-3, 25-3) of the liquid crystal layer 23-3 are in the diffusion state. FIG. 8(b-3) is the emitted light flux from the light diffusing panel 20 when the voltages are applied from the transparent conductive films 24-1, 25-1, 24-2, 25-2, 24-3 and 25-3 so that the transparent electrode areas (24-1, 25-1, 24-2, 25-2, 24-3 and 25-3) of all three liquid crystal layers 23-1 to 23-3 are in the diffusion state.

Sixth Embodiment

Figure 9:
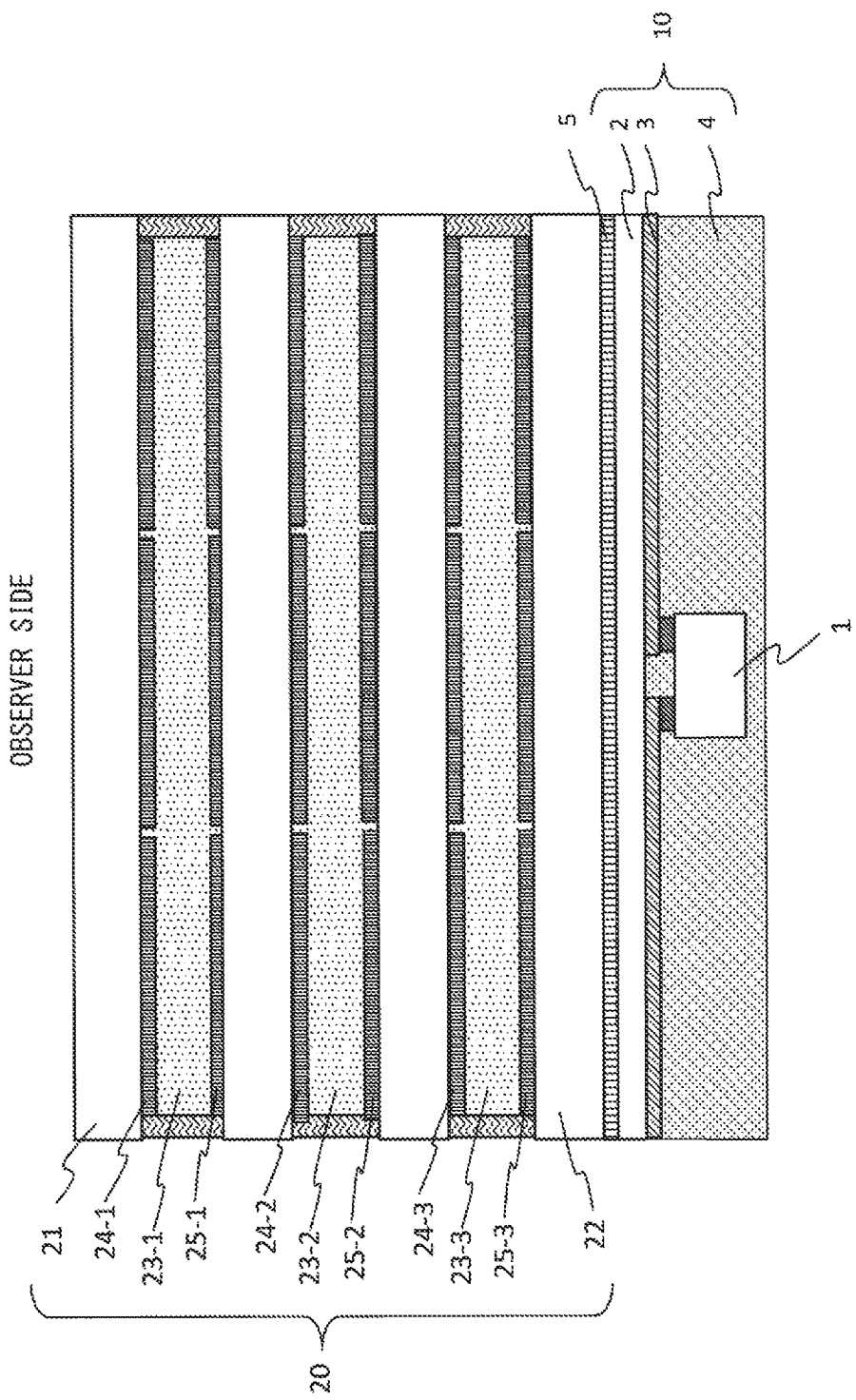
FIG. 9 is a cross-sectional view of the transparent panel provided with light emitting function of a sixth embodiment.

The transparent panel provided with light emitting function of a sixth embodiment will be described with reference to FIG. 9. FIG. 9 is a cross-sectional view of the transparent panel provided with light emitting function of the sixth embodiment.

In the present embodiment, the transparent conductive films 24-1, 25-1, 24-2, 25-2, 24-3 and 25-3 of the liquid crystal layers 23-1 to 23-3 are all divided into three in an in-plane direction. Thus, it is possible to select whether the liquid crystal layers 23-1 to 23-3 are in the diffusion state or the transparent state for each of three divided regions, thereby emitting light with the light flux diameter and gradation of intensity distribution designed more complicated than in the fifth embodiment.

In the present embodiment, a plurality of liquid crystal layer structures is used, however, a single liquid crystal layer structure can be used. For example, in a structure of the first embodiment, an area in the diffusion state is divided.

Seventh Embodiment

Figure 10:
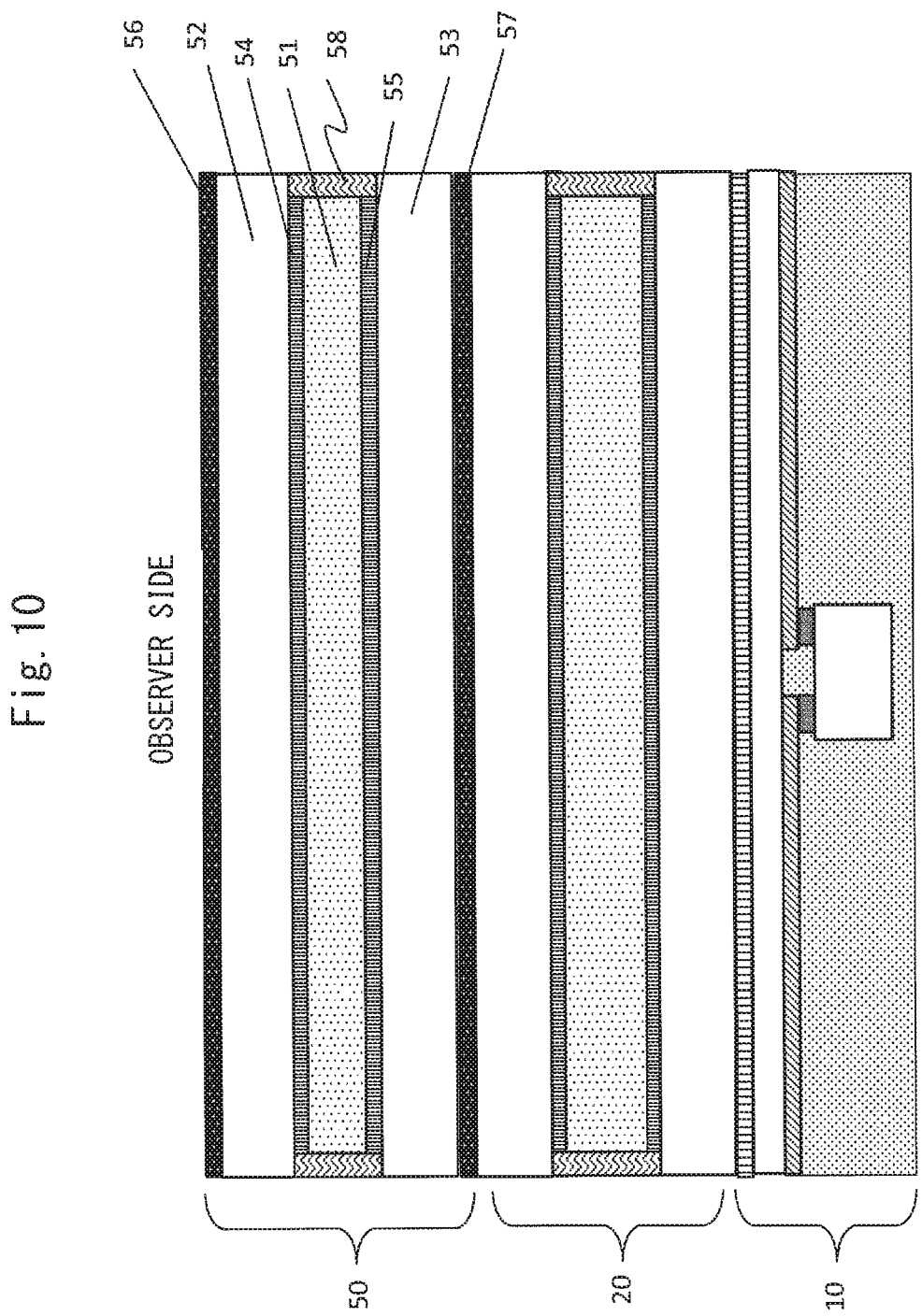
FIG. 10 is a cross-sectional view of the transparent panel provided with light emitting function of a seventh embodiment.

A liquid crystal device of a seventh embodiment will be described with reference to FIG. 10. FIG. 10 is a cross-sectional view of the liquid crystal device of the seventh embodiment.

As shown in FIG. 10, the liquid crystal device of the present embodiment has a structure in which a liquid crystal display panel 50 is mounted in close contact with and mounted on a surface of a light diffusing device of the transparent panel provided with light emitting function of the first embodiment. The light diffusing device of the transparent panel provided with light emitting function of the first embodiment operates as the light source of the liquid crystal display panel 50.

Since the liquid crystal display panel 50 has a widely known structure, it will be briefly described here. The liquid crystal display panel 50 is configured such that a liquid crystal layer 51 is sandwiched between light transmitting substrates 52 and 53. The liquid crystal layer 51 is a layer having a function different from that of the liquid crystal layer 23 described above, and is usually made of a material different from that of the liquid crystal layer 23. Transparent conductive films 54 and 55 are provided on surfaces of the light transmitting substrates 52 and 53 in contact with the liquid crystal layer 51. The transparent conductive films 54 and 55 are patterned according to contents to be displayed. Polarizing layers 56 and 57 are disposed on outer surfaces of the light transmitting substrates 52 and 53. Thus, by applying the voltage from the transparent conductive films 54 and 55 to the liquid crystal layer 51, if the liquid crystal molecules are arranged so that polarized light having passed through the polarizing layer 57 is changed to the polarized light in a direction passing through the polarizing layer 56, areas of the transparent conductive films 54 and 55 are in "bright" display. Conversely, by applying the voltage from the transparent conductive films 54 and 55 to the liquid crystal layer 51, if the liquid crystal molecules are arranged so that the polarized light having passed through the polarizing layer 57 is emitted as the polarized light in a direction not passing through the polarizing layer 56, the areas of the transparent conductive films 54 and 55 are in "dark" display.

Note that if the liquid crystal molecules are arranged so that the polarized light having passed through the polarizing layer 57 is emitted as the polarized light in the direction passing through the polarizing layer 56 when the voltage is applied to the liquid crystal layer, the above-described "dark" and "bright" displays are reversed.

As described in the first embodiment, the light diffusing panel 20 and the light source device 10 can be switched between the transparent state, the point light emitting state, and the surface light emitting state, so that they can be switched between a state in which the external light is incident on the liquid crystal display panel 50, a state in which point light emitting illumination is incident thereon, and a state in which surface light emitting illumination is incident thereon. Therefore, the liquid crystal display panel 50 can perform display in different modes depending on the state of each illumination light.

Since the transparent panel of the first embodiment in which the light diffusing panel 20 and the light source device 10 are in close contact with each other is thinner than a conventional backlight, the liquid crystal display device can be made thinner.

The light diffusing panel 20 and the liquid crystal display panel 50 of the seventh embodiment can be formed not only on an upper surface of the light source device 10 but also on a lower surface or both the upper and lower surfaces thereof.

By disposing the liquid crystal display panel 50 on the entire surface or at least a part of the light diffusing panel 20, it is possible to switch between at least four states of the transparent state, the point light emitting state, the surface light emitting state, and a light shielding state.

It is also possible that the light diffusing panel 20 and the liquid crystal display panel 50 are mounted on the upper surface of the light source device 10, and only the liquid crystal display panel 50 is mounted on the lower surface of the light source device 10. In this case, by controlling the liquid crystal display panel 50 on the lower surface side of the light source device 10, the light to the lower surface side can be shielded when desired.

Eighth Embodiment

Figure 11:
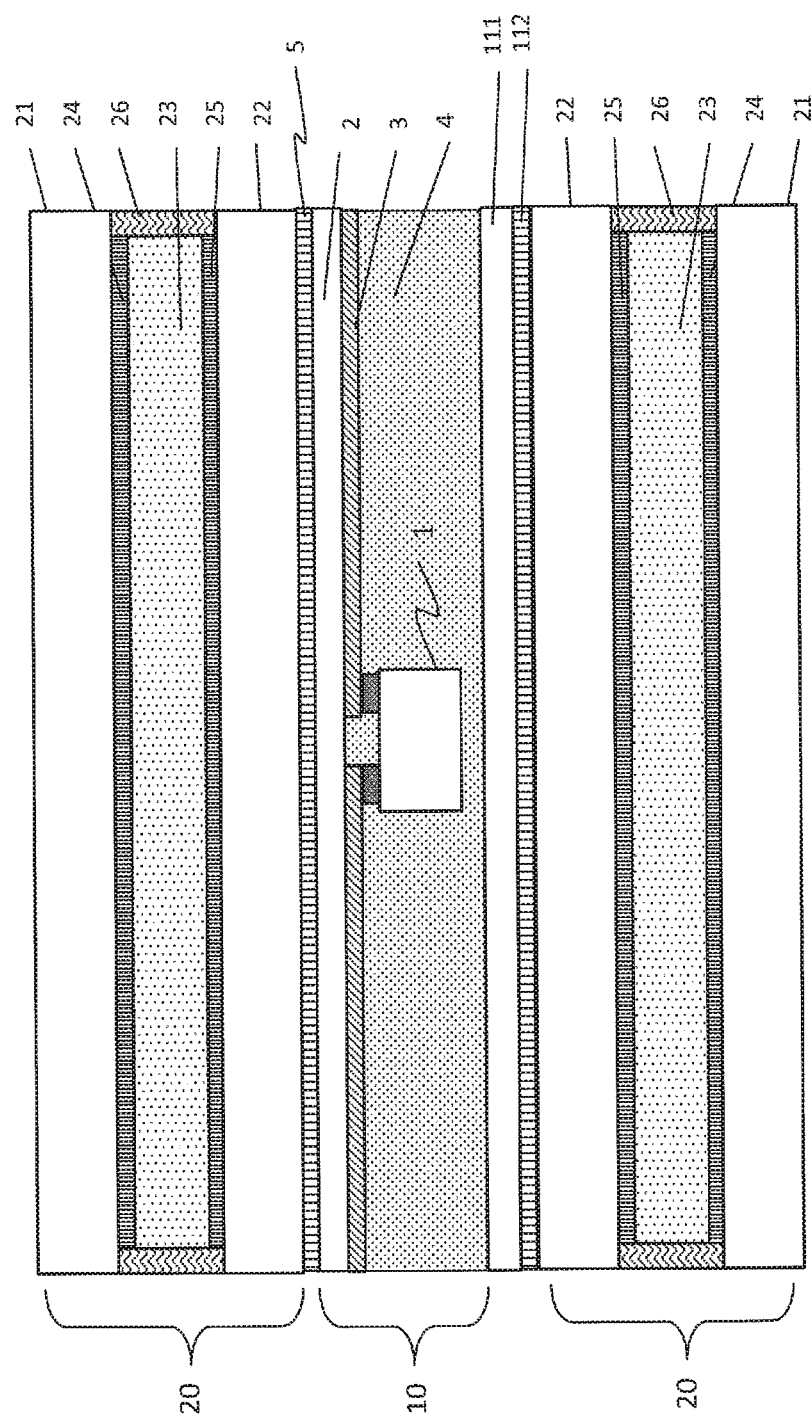
FIG. 11 is a cross-sectional view of the transparent panel provided with light emitting function of an eighth embodiment.

The transparent panel of an eighth embodiment will be described with reference to FIG. 11. FIG. 11 is a cross-sectional view of the transparent panel provided with light emitting function of the eighth embodiment.

The transparent panel of the eighth embodiment has a structure in which the light diffusing panels 20 are arranged on both surfaces of the light source device 10 of the transparent panel of the first embodiment. In such a structure, by using a double-sided light emitting type as the LED die 1, the light emitted from the LED die 1 can be emitted upward and downward from both sides of the transparent panels.

That is, it is possible to switch between the transparent state, the point light emitting state, and the surface light emitting state, and to select whether the both surfaces are respectively set to the point light emitting state or the surface light emitting state. That is, when the upper light diffusing panel 20 is in the diffusion state and the lower light diffusing panel 20 is in the transparent state, the upper is in the surface light emitting state and the lower is in the point light emitting state. Similarly, the upper can be the point light emitting state, and the lower can be the surface light emitting state.

When both the upper and lower light diffusing panels 20 are in the transparent state and the LED die 1 is not allowed to emit light, the transparent panel is in the transparent state of transmitting the external light.

In a structure of FIG. 11, a light transmitting substrate 111 is disposed to be in contact with the sealing resin layer 4 so that the upper and lower structures are the same with the sealing resin layer 4 of the light source device 10 interposed therebetween, and the lower light diffusing panel 20 is bonded to the light transmitting substrate 111 via a transparent adhesive layer 112.

Figure 12:
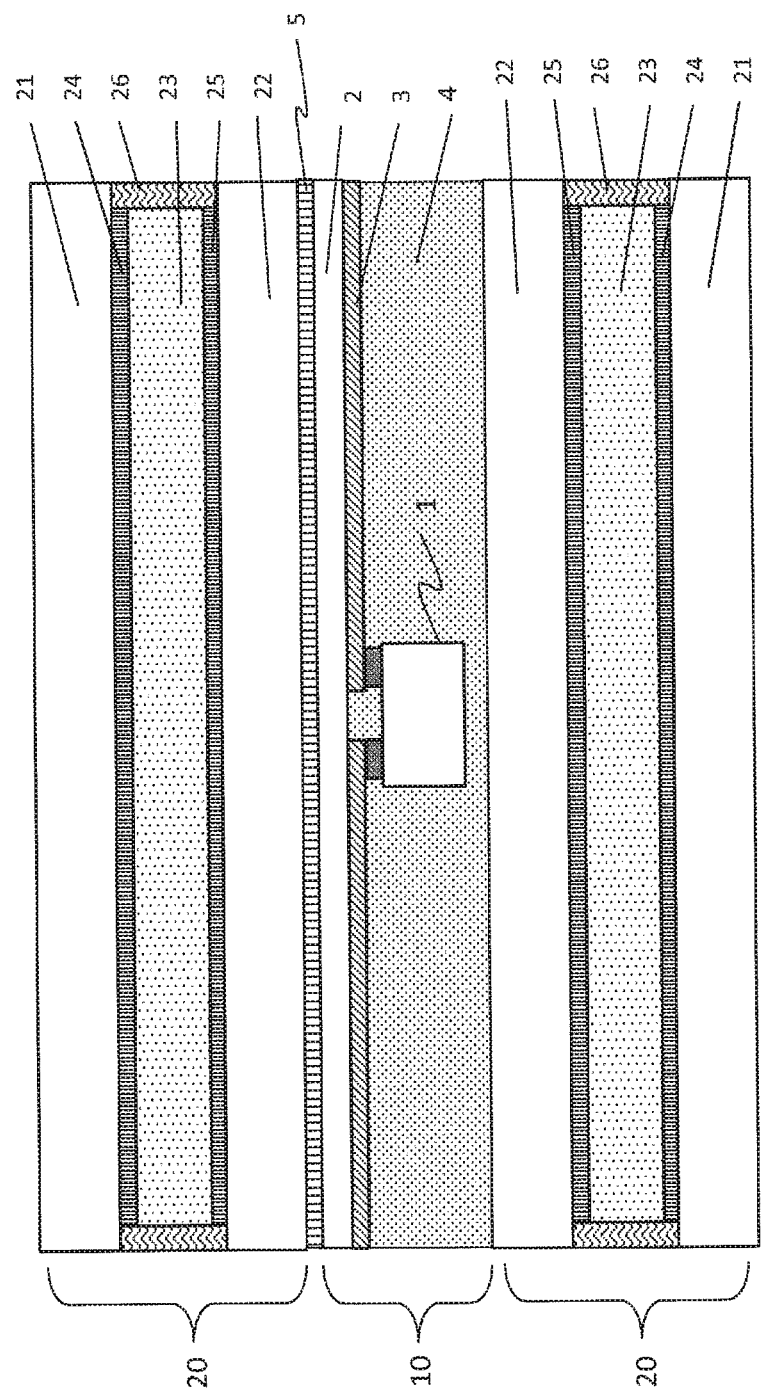
FIG. 12 is a cross-sectional view of another example of the transparent panel provided with light emitting function of the eighth embodiment.

However, the present embodiment is not limited to the structure of FIG. 11. As shown in FIG. 12, after a lower light diffusing panel 20 is bonded using adhesive force of the uncured sealing resin layer 4, the sealing resin layer 4 may be cured, so that the light diffusing panel 20 is bonded directly to the sealing resin layer 4.

Figure 13:
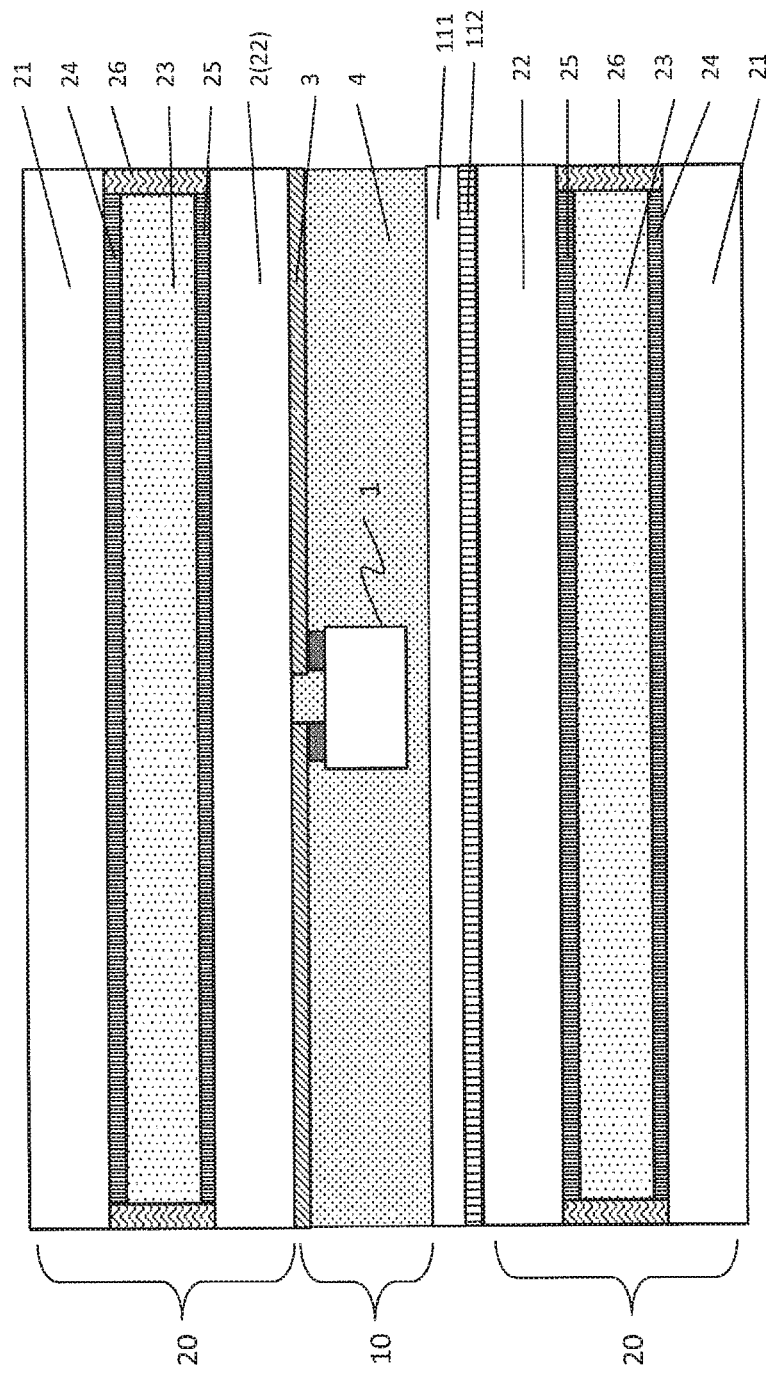
FIG. 13 is a cross-sectional view of another example of the transparent panel provided with light emitting function of the eighth embodiment.

As shown in FIG. 13, similarly to the second embodiment, the light transmitting substrate 22 of the upper light diffusing panel 20 may also serve as the light transmitting substrate 2 of the light source device 10.

Figure 14:
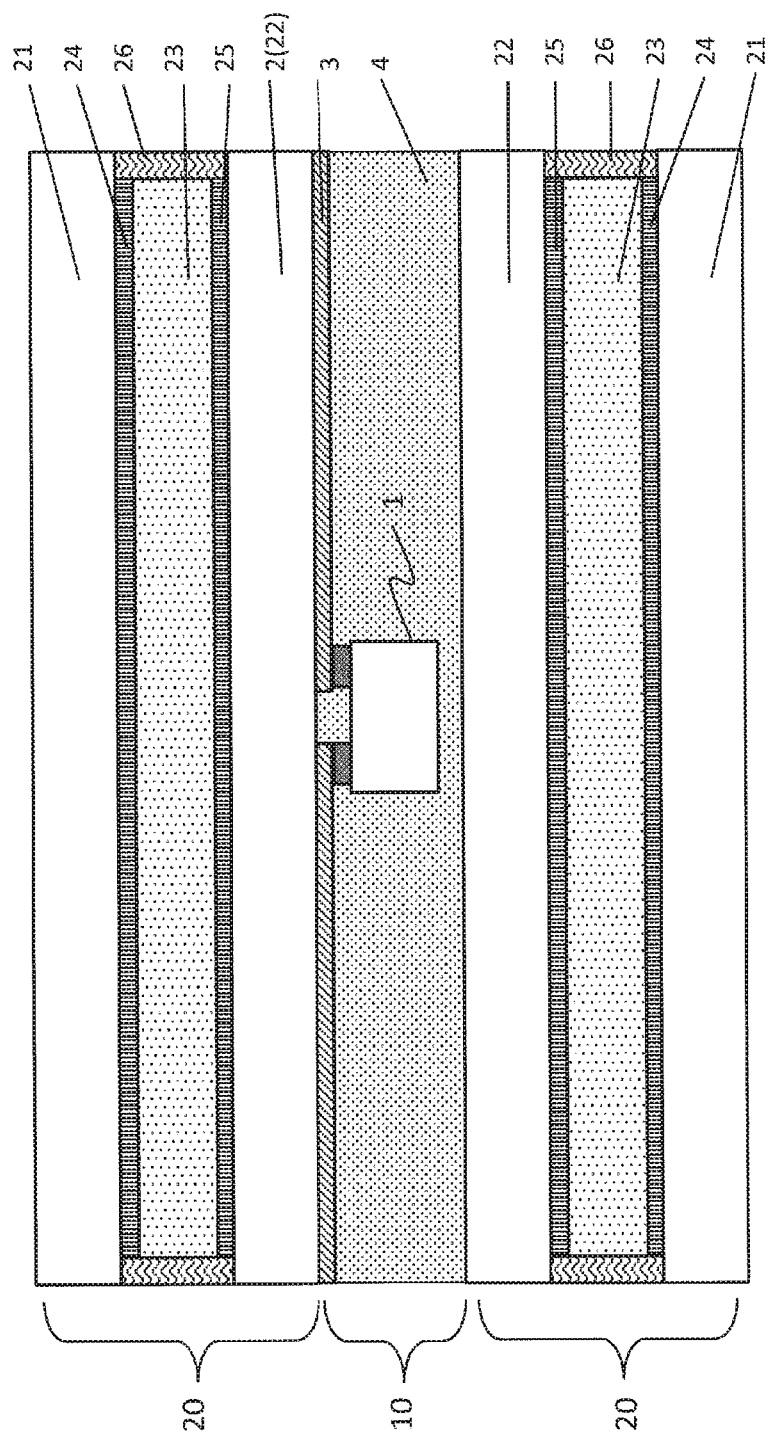
FIG. 14 is a cross-sectional view of another example of the transparent panel provided with light emitting function of the eighth embodiment.

Further, as shown in FIG. 14, the light transmitting substrate 22 of the upper light diffusing panel 20 may also serve as the light transmitting substrate 2 of the light source device 10, and the light transmitting substrate 21 of the lower light diffusing panel 20 may be directly bonded to the sealing resin layer 4 of the light source device 10.

Figure 15:
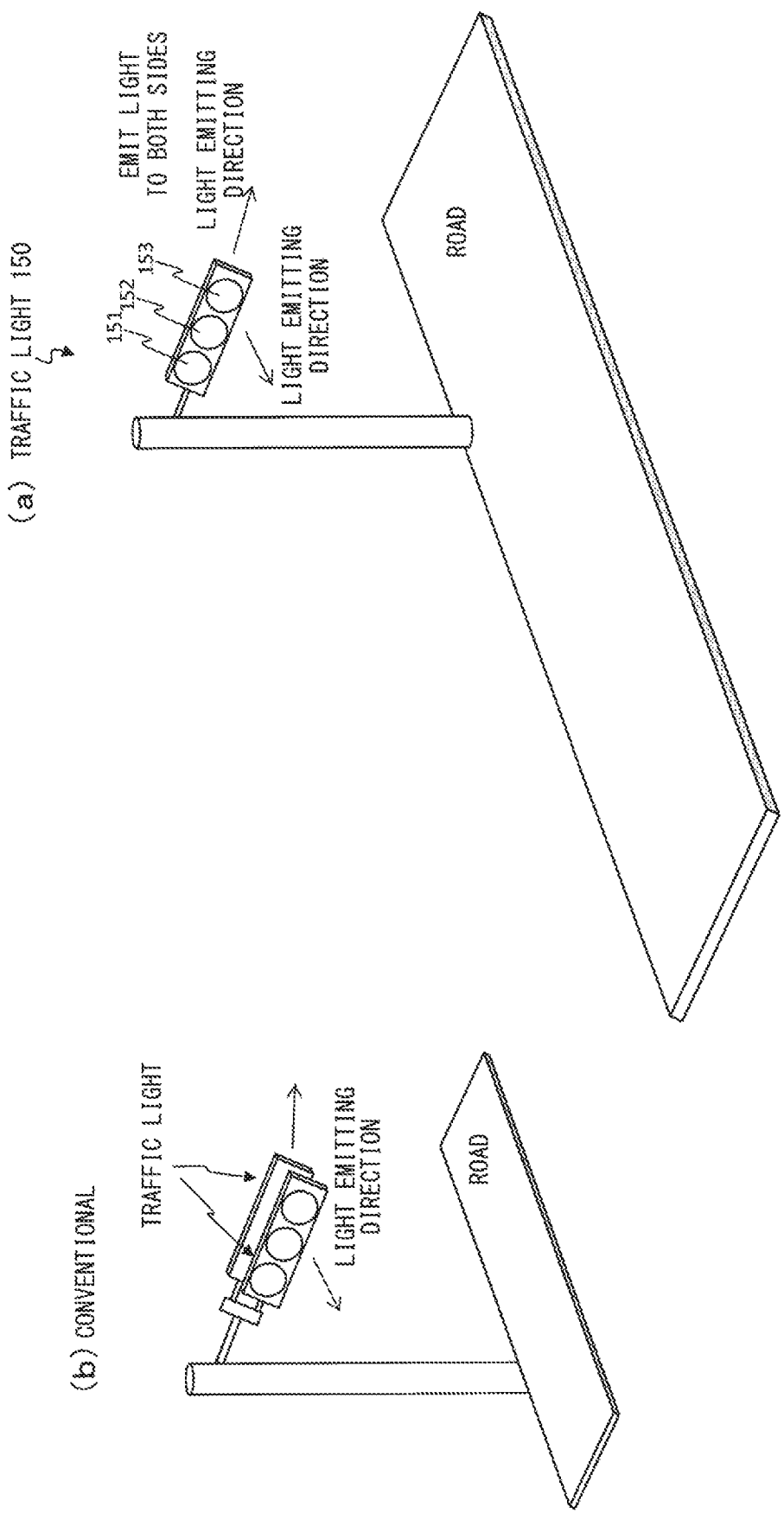
FIG. 15(*a*) is a perspective view of a vehicle traffic light using the transparent panel provided with light emitting function of the eighth embodiment, and FIG. 15(*b*) is a perspective view of a conventional vehicle traffic light.

FIG. 15(a) shows an example in which the transparent panel capable of emitting light on both sides of the eighth embodiment is used as the light sources 151, 152, and 153 of a vehicle traffic light 150. The transparent panel of the present embodiment can emit light from both sides while having a single structure. Therefore, unlike a conventional traffic light of FIG. 15(b), it is not necessary to arrange two traffic lights back to back, and the traffic light can be made thin.

Ninth Embodiment

Figure 16:
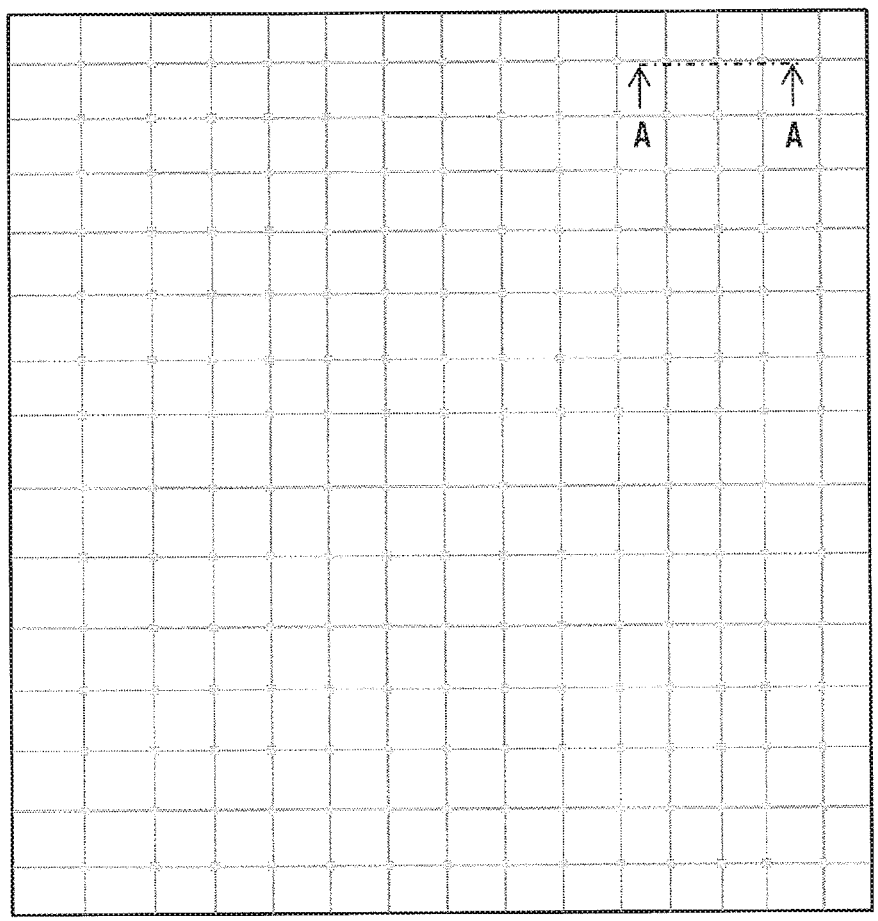
FIG. 16 is a top view of a light source device 10 of the transparent panel provided with light emitting function of a ninth embodiment.
Figure 17:
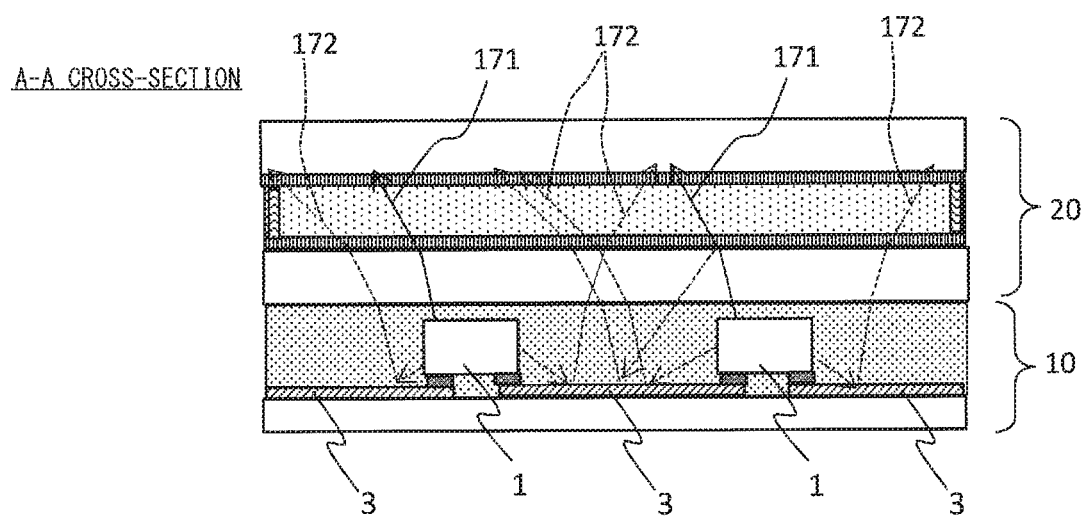
FIG. 17 is a cross-sectional view taken along a line A-A of the transparent panel provided with light emitting function of the ninth embodiment.

The transparent panel of a ninth embodiment will be described with reference to FIGS. 16 and 17. FIG. 16 is a top view of the light source device 10 of the transparent panel provided with light emitting function of the ninth embodiment (however, the sealing resin layer 4 is removed). FIG. 17 is a cross-sectional view of the transparent panel at position AA in FIG. 16.

In the light source device 10 of the transparent panel of the ninth embodiment, the LED dies 1 are arranged longitudinally and laterally at intervals in a matrix form.

In order to individually turn on an arbitrary LED die 1 of the plurality of LED dies 1 arranged in a matrix, the wiring pattern 3 includes a longitudinal wiring pattern 3-1, a lateral wiring pattern 3-2. The LED die 1 is disposed at a position where the longitudinal wiring pattern 3-1 and the lateral wiring pattern 3-2 cross each other, and current can be individually supplied to the plurality of LED dies 1.

As shown in FIG. 17, the light diffusing panel 20 is in close contact with and fixed to the surface of the sealing resin layer 4 of the light source device 10 as in the second embodiment.

With such a structure, one or more LED dies 1 at desired positions can emit light, and thus light emission representing display contents such as desired patterns or characters can be performed. Therefore, by switching the light diffusing panel 20 between the transparent state or the diffusion state, a two-dimensional display for sequentially displaying desired contents in the point light emitting state or the surface light emitting state can be realized by the transparent panel.

At this time, as shown in FIG. 17, among the light emitted upward from the LED die 1, light 171 transmitted through the liquid crystal layer 23 is emitted from the upper surface of the light diffusing panel 20 as it is or after being diffused depending on a state of the liquid crystal layer 23. On the other hand, the light emitted from a side surface of the LED die 1 and the light reflected by the liquid crystal layer 23 or the transparent conductive film 25 return to the light source device 10 side, however, a part thereof is reflected by the wiring pattern 3-1, 3-2, incident on the liquid crystal layer 23 again, and emitted from the upper surface of the light diffusing panel 20.

As described above, the transparent panel of the present embodiment can reflect a part of the light reflected by the light diffusing panel 20 by the wiring patterns 3-1 and 3-2 and make it incident on the light diffusing panel 20 again, and thus light extraction efficiency of the light emitted from the LED die 1 can be improved.

Note that the entire transparent panel can be made transparent by turning off the LED die 1 and making the light diffusing panel 20 transparent.

Tenth Embodiment

The transparent panel of the tenth embodiment will be described with reference to FIG. 18(*a*) and FIG. 18(*b*). FIG. 18(*a*) is a cross-sectional view of the transparent panel provided with light emitting function of the tenth embodiment, and FIG. 18(*b*-1) to FIG. 18(*b*-4) are examples of light emission patterns of the upper surface of the light diffusing panel 20 of the transparent panel.

As shown in FIG. 18(*a*), the transparent panel of the present embodiment has the same structure as that of the first embodiment, however, the transparent conductive films 24 and 25 are divided into areas 24*a* and 25*a* displaying predetermined characters and its surrounding areas 24*b* and 25*b* as shown in FIG. 18(*b*-1) to FIG. 18(*b*-4).

When the voltage for bringing the liquid crystal layer 23 into the diffusion state is applied to the areas 24*a* and 25*a* displaying the predetermined characters, and the voltage for bringing the liquid crystal layer 23 into the transparent state is applied to the surrounding areas 24*b* and 25*b*, the areas 24*a* and 25*a* where the light emitted from the LED die 1 is diffused are in the surface light emitting state and the surrounding areas are in the point light emitting state, so that the displays of FIG. 18(*b*-1) and FIG. 18(*b*-3) are obtained. Conversely, when the voltage for bringing the liquid crystal layer 23 into the transparent state is applied to the areas 24*a* and 25*a* displaying the predetermined characters, and the voltage for bringing the liquid crystal layer 23 in the diffusion state is applied to the surrounding areas 24*b* and 25*b*, the areas 24*b* and 25*b* where the light emitted from the LED die 1 is diffused are in the surface light emitting state, and the areas 24*a* and 25*a* displaying the characters are in the point light emitting state, so that the displays of FIG. 18(*b*-2) and FIG. 18(*b*-4) are obtained.

Further, the entire transparent panel can be brought into the transparent state by turning off the LED die 1 and bringing the light diffusing panel 20 into the transparent state.

FIG. 18(*a*) shows an example in which the light source device 10 includes only one LED die 1, but the present embodiment is not limited to this structure. For example, the plurality of LED dies 1 may be arranged in the light source device 10, or the plurality of LED dies 1 may be uniformly arranged on a light emitting surface of the light source device 10.

Further, in the embodiments shown in FIGS. 1, 3 to 7, 9 to 14, and 17, the number of LED dies 1 is not limited to one or two as in the case of FIG. 18(*a*) described above, but the plurality of LED dies 1 may be uniformly arranged on the light emitting surface of the light source device 10.

Since the transparent panel and the liquid crystal device of each embodiment described above can be switched between the transparent state, the surface light emitting state, and the point light emitting state, it can be transparent in a normal state and perform display by surface light emission or point light emission as necessary, by using them for a windshield or a rear glass of an automobile. Therefore, it is possible to realize a head-up display for displaying on the windshield and a structure for performing predetermined display on the rear glass toward the following vehicle in an emergency.

In addition to these, the transparent panel and the liquid crystal device can be suitably used for lighting equipment (point emitting/surface emitting lighting, flexible lighting, automotive lighting (interior, extension) or the like), display equipment (see-through display, wearable display, head-up display or the like), production equipment (for example, production lighting and display for game equipment (pachinko)), and the like.

Note that when an apparatus using the transparent panel of the present embodiment does not require the transparent state of the transparent plate, and it is only necessary to switch between the point light emitting state and the surface light emitting state, an opaque substrate can be used as the light transmitting substrate 2 for LED of FIG. 3(*a*).

DESCRIPTION OF REFERENCE NUMERALS AND SIGNS

1: LED die, 2: light transmitting substrate for LED, 3: wiring pattern, 4: sealing resin layer, 5: adhesive layer, 10: light source device, 20: light diffusing panel, 21, 22: light transmitting substrate for liquid crystal, 23: liquid crystal layer, 24, 25: transparent conductive film, 26: sealing resin, 50: liquid crystal display panel, 51: liquid crystal layer, 52, 53: light transmitting substrate, 54, 55: transparent conductive film, 56, 57: polarizing layer, 58: sealing resin, 111: light transmitting substrate, 112: adhesive layer, 150: vehicle traffic light, 151, 152, 153: light source.

The invention claimed is:

1. A transparent panel provided with light emitting function, comprising:
    an LED die;
    a light transmitting substrate for LED (2), on which the LED die is mounted;
    a wiring pattern (3) provided on a surface of the light transmitting substrate for LED and bonded to the LED die; and
    a light diffusing panel (20) laminated on the light transmitting substrate for LED,
    wherein the light diffusing panel comprises a pair of light transmitting substrates for liquid crystal 21, 22, a liquid crystal layer sandwiched between the pair of light transmitting substrates for liquid crystal, and transparent conductive films disposed on the light transmitting substrates for liquid crystal, and the light diffusing panel is switchable between a transparent state and a light diffusion state, and
    wherein said light diffusing panel and said light transmitting substrate for LED are bonded together by a light transmitting resin layer or an adhesive film having optical transparency.

2. The transparent panel provided with light emitting function according to claim 1, wherein the wiring pattern contains conductive particles.

3. The transparent panel provided with light emitting function according to claim 1, wherein the wiring pattern is obtained by sintering conductive particles.

4. The transparent panel provided with light emitting function according to claim 3, wherein the wiring pattern is obtained by sintering the conductive particles by electromagnetic waves.

5. The transparent panel provided with light emitting function according to claim 2, wherein the conductive particles contain metal or metal oxide.

6. The transparent panel provided with light emitting function according to claim 1, wherein the LED die is bonded to the wiring pattern by electromagnetic wave sintering.

7. The transparent panel provided with light emitting function according to claim 1, wherein in the light transmitting substrate for LED, a surface on which the LED die is not mounted is fixed to the light diffusing panel.

8. The transparent panel provided with light emitting function according to claim 1, wherein the light transmitting substrate for LED is further mounted with a sealing resin layer so as to embed the LED die therein, and a surface of the sealing resin layer is fixed to the light diffusing panel.

9. The transparent panel provided with light emitting function according to claim 1, wherein the light transmitting substrate for LED also serves as the light transmitting substrate for liquid crystal, one surface thereof is in contact with the liquid crystal layer, and the LED die is mounted on the other surface thereof.

10. The transparent panel provided with light emitting function according to claim 1, comprising two or more light diffusing panels.

11. A transparent panel provided with light emitting function, comprising:
    an LED die;
    a light transmitting substrate for LED, on which the LED die is mounted;
    a wiring pattern provided on a surface of the light transmitting substrate for LED and bonded to the LED die; and
    at least two light diffusing panels laminated on the light transmitting substrate for LED,
    wherein each light diffusing panel comprises a pair of light transmitting substrates for liquid crystal, a liquid crystal layer sandwiched between the pair of light transmitting substrates for liquid crystal, and transparent conductive films disposed on the light transmitting substrates for liquid crystal, and the light diffusing panel is switchable between a transparent state and a light diffusion state, and
    wherein the transparent conductive films of the light diffusing panels are respectively divided into a plurality of regions, and voltage can be applied to each region.

12. A transparent panel provided with light emitting function,
    an LED die;
    a light transmitting substrate for LED, on which the LED die is mounted;
    a wiring pattern provided on a surface of the light transmitting substrate for LED and bonded to the LED die; and
    at least two light diffusing panels laminated on the light transmitting substrate for LED,
    wherein each light diffusing panel comprises a pair of light transmitting substrates for liquid crystal, a liquid crystal layer sandwiched between the pair of light transmitting substrates for liquid crystal, and transparent conductive films disposed on the light transmitting substrates for liquid crystal, and the light diffusing panel is switchable between a transparent state and a light diffusion state, and
    wherein the transparent conductive films of the light diffusing panels have different areas for each light diffusing panel.

13. The transparent panel provided with light emitting function according to claim 10, wherein the light transmitting substrate for LED on which the LED die is mounted is sandwiched between two pieces of the light diffusing panels.

14. The transparent panel provided with light emitting function according to claim 1, further comprising a liquid crystal display device laminated on the light diffusing panel,
    wherein the liquid crystal display device comprises a pair of light transmitting substrates for liquid crystal, a liquid crystal layer sandwiched between the pair of light transmitting substrates for liquid crystal, and the transparent conductive films and polarizing layers disposed on the light transmitting substrates for liquid crystal, and light emitted from the LED die and passed through the light diffusing panel is incident on the liquid crystal display device.

15. The transparent panel provided with light emitting function according to claim 14, wherein the light diffusing panels are respectively disposed on both surfaces of the light transmitting substrate for LED on which the LED die is mounted, and the liquid crystal display device is laminated on each of the light diffusing panels.

16. The transparent panel provided with light emitting function according to claim 1, wherein the LED dies are arranged longitudinally and laterally at intervals.

17. The transparent panel provided with light emitting function according to claim 16, wherein the wiring pattern includes a longitudinal wiring pattern and a lateral wiring pattern, and the LED dies are arranged at positions in which the longitudinal wiring pattern and the lateral wiring pattern cross each other or in a vicinity thereof, and current can be individually supplied to the LED dies.

18. The transparent panel provided with light emitting function according to claim 1, wherein the wiring pattern has a ratio of thickness to width (=thickness/width) of 1/100 or more.

19. The transparent panel provided with light emitting function according to claim 1, wherein the wiring pattern is directly fixed to the surface of the light transmitting substrate.

* * * * *